United States Patent
Moon et al.

(10) Patent No.: US 9,673,354 B2
(45) Date of Patent: Jun. 6, 2017

(54) LIGHT EMITTING DEVICE

(71) Applicant: LG INNOTEK CO., LTD., Seoul (KR)

(72) Inventors: Ji Hyung Moon, Seoul (KR); Sang Youl Lee, Seoul (KR); Bum Doo Park, Seoul (KR); Chung Song Kim, Seoul (KR); Sang Rock Park, Seoul (KR); Byung Hak Jeong, Seoul (KR); Tae Yong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/725,469

(22) Filed: May 29, 2015

(65) Prior Publication Data
US 2015/0349220 A1    Dec. 3, 2015

(30) Foreign Application Priority Data

May 30, 2014   (KR) .......... 10-2014-0065759
May 30, 2014   (KR) .......... 10-2014-0065763
(Continued)

(51) Int. Cl.
*H01L 33/00*   (2010.01)
*H01L 33/38*   (2010.01)
(Continued)

(52) U.S. Cl.
CPC ............ *H01L 33/38* (2013.01); *H01L 33/387* (2013.01); *H01L 33/405* (2013.01); *H01L 33/42* (2013.01); *H01L 33/46* (2013.01)

(58) Field of Classification Search
CPC ...... H01L 33/38; H01L 33/387; H01L 33/405
(Continued)

(56) References Cited

U.S. PATENT DOCUMENTS 6,057,562 A  *  5/2000  Lee .................. H01L 33/02
                                                  257/103
2003/0234404 A1   12/2003  Matsuoka et al.
(Continued)

FOREIGN PATENT DOCUMENTS

EP          0 886 326 A2    12/1998
JP          2007-287786 A   11/2007
(Continued)

*Primary Examiner* — Benjamin Sandvik
*Assistant Examiner* — Herve Assouman
(74) *Attorney, Agent, or Firm* — Birch, Stewart, Kolasch & Birch, LLP

(57) ABSTRACT

Disclosed is a light emitting device including a light emitting structure including a first conductive semiconductor layer, an active layer under the first conductive semiconductor layer, and a second conductive semiconductor layer under the active layer, a first electrode electrically connected with the first conductive semiconductor layer, a mirror layer under the light emitting structure, a window semiconductor layer between the mirror layer and the light emitting structure, a reflective layer under the mirror layer, a conductive contact layer between the reflective layer and the window semiconductor layer and in contact with the second conductive semiconductor layer, and a conductive support substrate under the reflective layer. The window semiconductor layer includes a C-doped P-based semiconductor doped with a higher dopant concentration. The conductive contact layer includes material different from that of the mirror layer with a thickness thinner than that of the window semiconductor layer.

18 Claims, 20 Drawing Sheets

(30) Foreign Application Priority Data

| Jun. 17, 2014 | (KR) | ........................ 10-2014-0073250 |
| Jun. 17, 2014 | (KR) | ........................ 10-2014-0073251 |
| Jun. 17, 2014 | (KR) | ........................ 10-2014-0073252 |
| Jun. 17, 2014 | (KR) | ........................ 10-2014-0073253 |
| Jun. 17, 2014 | (KR) | ........................ 10-2014-0073282 |

(51) Int. Cl.
*H01L 33/40* (2010.01)
*H01L 33/42* (2010.01)
*H01L 33/46* (2010.01)

(58) Field of Classification Search
USPC .......................................................... 257/98
See application file for complete search history.

(56) References Cited

U.S. PATENT DOCUMENTS

| 2005/0199888 | A1 | 9/2005 | Seong et al. |
| 2008/0290349 | A1 | 11/2008 | Takahashi |
| 2009/0173962 | A1 | 7/2009 | Hanawa et al. |
| 2010/0283081 | A1* | 11/2010 | Huang .................. H01L 33/387 257/99 |
| 2011/0024781 | A1* | 2/2011 | Fujimoto ................ H01L 33/20 257/98 |
| 2011/0114988 | A1* | 5/2011 | Sabathil ................ H01L 33/387 257/99 |
| 2011/0198563 | A1 | 8/2011 | Kim et al. |
| 2011/0298002 | A1 | 12/2011 | Takeuchi et al. |
| 2012/0273793 | A1* | 11/2012 | Nishikawa .............. H01L 33/14 257/76 |
| 2013/0256731 | A1 | 10/2013 | Fu et al. |

FOREIGN PATENT DOCUMENTS

| KR | 2001-0093791 A | 10/2001 |
| KR | 10-2004-0002471 A | 1/2004 |
| KR | 10-2005-0090919 A | 9/2005 |
| KR | 10-2011-0092728 A | 8/2011 |
| KR | 10-2011-0093472 A | 8/2011 |
| KR | 10-2011-0107869 A | 10/2011 |
| KR | 10-2013-0027275 A | 3/2013 |
| WO | WO 2011/145850 A2 | 11/2011 |

* cited by examiner

LIGHT EMITTING DEVICE

CROSS-REFERENCE TO RELATED APPLICATIONS

The present application claims priority under 35 U.S.C. §119(a) of Korean Patent Application Nos. 10-2014-0065759 and 10-2014-0065763, filed on May 30, 2014, and 10-2014-0073250, 10-2014-0073251, 10-2014-0073252, 10-2014-0073253, and 10-2014-0073282, filed on Jun. 17, 2014, which is hereby incorporated by reference in its entirety.

BACKGROUND

The embodiment relates to a light emitting device, a light emitting device package, and a light unit.

A light emitting diode (LED) has been extensively used as one of a light emitting device. The LED converts an electrical signal in the form of an infrared light, a visible light, or an ultraviolet light due to the characteristic of a compound semiconductor.

As the light efficiency of the light emitting device is increased, the light emitting device has been applied to various fields such as a display device and a lighting device.

SUMMARY

The embodiment provides a light emitting device capable of lowering operating voltage and improving a light speed, a light emitting device package, and a light unit.

The embodiment provides a light emitting device capable of improving a light speed and ensuring reliability, a light emitting device package, and a light unit.

The embodiment provides a light emitting device having gallium phosphide (GaP)-based semiconductor doped with carbon (C).

The embodiment provides a light emitting device capable of reducing light absorption in a conductive contact layer contacted with a GaP-based semiconductor doped with C.

The embodiment provides a light emitting device capable of increasing a current contact area of a conductive contact layer contacted with a GaP-based semiconductor doped with C.

The embodiment provides a light emitting device capable of improving light reflection efficiency by providing an omni directional reflector (ODR) layer under a distributed Bragg reflector (DBR) layer provided under a GaP-based semiconductor doped with C.

The embodiment provides a light emitting device capable of improving current spreading by a conductive contact layer contacted with a bottom surface of a GaP-based semiconductor doped with C.

The embodiment provides a light emitting device capable of improving light extraction efficiency, a light emitting device package, and a light unit.

According to the embodiment, there is provided a light emitting device including a light emitting structure including a first conductive semiconductor layer, an active layer under the first conductive semiconductor layer, and a second conductive semiconductor layer under the active layer, a window semiconductor layer under the light emitting structure, a mirror layer under the window semiconductor layer, a reflective layer under the mirror layer, a bonding layer disposed under the reflective layer and at a peripheral portion of the reflective layer and having a top surface contacted with the mirror layer, and a support substrate under the bonding layer.

According to the embodiment, there is provided a light emitting device including a light emitting structure including a first conductive semiconductor layer, an active layer under the first conductive semiconductor layer, and a second conductive semiconductor layer under the active layer, a first electrode electrically connected with the first conductive semiconductor layer, a mirror layer under the light emitting structure, a window semiconductor layer between the mirror layer and the light emitting structure, a reflective layer under the mirror layer, a conductive contact layer disposed between the reflective layer and the window semiconductor layer and contacted with the second conductive semiconductor layer, and a support substrate having a conductive property under the reflective layer. The window semiconductor layer includes a phosphorus (P)-based semiconductor doped with carbon (C), the window semiconductor layer has a dopant concentration higher than a dopant concentration of the second conductive semiconductor layer, and the conductive contact layer includes a material different from a material of the mirror layer, and has a thickness thinner than a thickness of the window semiconductor layer.

According to the embodiment, there is provided a light emitting device including a first conductive semiconductor layer, an active layer under the first conductive semiconductor layer, and a second conductive semiconductor layer under the active layer, a first electrode on the first conductive semiconductor layer, an electrode pad on the first electrode, a mirror layer under the light emitting structure, a window semiconductor layer between the mirror layer and the light emitting structure, a reflective layer under the mirror layer, a conductive contact layer disposed between the reflective layer and the window semiconductor layer and contacted with the second conductive semiconductor layer, and a support substrate having a conductive property and disposed under the reflective layer. The window semiconductor layer includes a phosphorus (P)-based semiconductor doped with carbon (C) and has a dopant concentration higher than a dopant concentration of the second conductive semiconductor layer, the conductive contact layer includes a material different from a material of the mirror layer and includes a plurality of contact parts spaced apart from each other, and a contact area between the conductive contact layer and the electrode pad is increased proportionally to a distance between the electrode pad the conductive contact layer.

According to the embodiment, there is provided a light emitting device including a first conductive semiconductor layer, an active layer under the first conductive semiconductor layer, and a second conductive semiconductor layer under the active layer, a window semiconductor layer under the light emitting structure, a conductive contact layer disposed under the window semiconductor layer and electrically connected with the second conductive semiconductor layer, and a first electrode disposed on the light emitting structure and electrically connected with the first conductive semiconductor layer. The conductive contact layer includes a plurality of ohmic contact regions spaced apart from each other, disposed in the form of plural dots, and making ohmic-contact with the window semiconductor layer. The whole area of the ohmic contact regions is in a range of 0.5% to 1.5% of the whole area of the window semiconductor layer.

According to the embodiment, there is provided a light emitting device including a light emitting structure including a first conductive semiconductor layer, an active layer under the first conductive semiconductor layer, and a second conductive semiconductor layer under the active layer, a first electrode electrically connected with the first conductive semiconductor layer, a mirror layer under the light emitting structure, a window semiconductor layer between the mirror layer and the light emitting structure, a reflective layer under the mirror layer, a low-refractive index layer disposed between the reflective layer and the mirror layer, and a support substrate having a conductive property under the reflective layer. The window semiconductor layer includes a phosphorus (P)-based semiconductor doped with carbon (C), the low-refractive index layer includes a material different from that of the mirror layer and has a refractive index lower than that of the window semiconductor layer, and the mirror layer has a DBR layer structure including two dielectric layers having mutually different refractive indexes, and the low-refractive index layer and the reflective layer has an ODR structure.

According to the embodiment, there is provided a light emitting structure including a first conductive semiconductor layer, an active layer under the first conductive semiconductor layer, and a second conductive semiconductor layer under the active layer, a first electrode electrically connected with the first conductive semiconductor layer, a mirror layer under the light emitting structure, a window semiconductor layer between the mirror layer and the light emitting structure, a reflective layer under the mirror layer, a conductive contact layer disposed between the reflective layer and the window semiconductor layer and contacted with the second conductive semiconductor layer, and a support substrate having a conductive property under the reflective layer. The window semiconductor layer includes a phosphorus (P)-based semiconductor doped with carbon (C), has a dopant concentration higher than a dopant concentration of the second conductive semiconductor layer, and has a thickness thicker than that of the conductive contact layer. The conductive contact layer includes a material different from a material of the mirror layer.

According to the embodiment, there is provided a light emitting structure including a first conductive semiconductor layer, an active layer under the first conductive semiconductor layer, and a second conductive semiconductor layer under the active layer, a first electrode electrically connected with the first conductive semiconductor layer, a mirror layer under the light emitting structure, a window semiconductor layer between the mirror layer and the light emitting structure, a reflective layer under the mirror layer, a conductive contact layer disposed between the reflective layer and the window semiconductor layer and contacted with the second conductive semiconductor layer, and a support substrate having a conductive property under the reflective layer. The window semiconductor layer includes a phosphorus (P)-based semiconductor doped with carbon (C) and the conductive contact layer includes a material different from that of the mirror layer. The conductive contact layer includes a plurality of first contact parts having an entire portion of a top surface overlapped with the light emitting structure in a vertical direction, respectively; and a plurality of second contact parts having a portion of a top surface provided outward from a sidewall of the light emitting structure.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

Hereinafter, a light emitting device, a light emitting device package, a light unit, and a method of fabricating the light emitting device according to the embodiment will be described in detail with reference to accompanying drawings.

Figure 1:
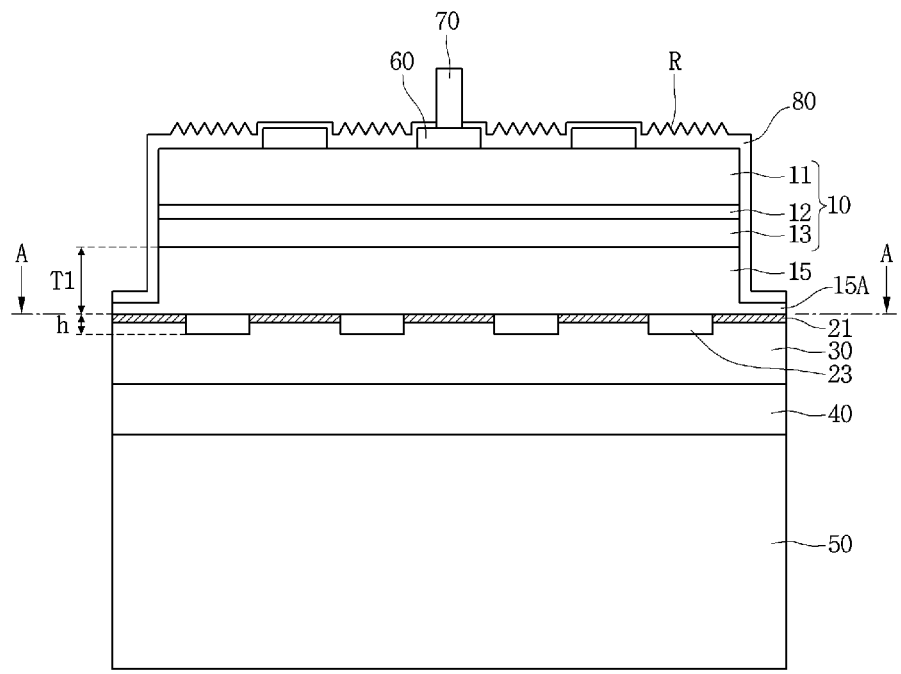
FIG. 1 is a sectional view showing a light emitting device according to the first embodiment.
Figure 2:
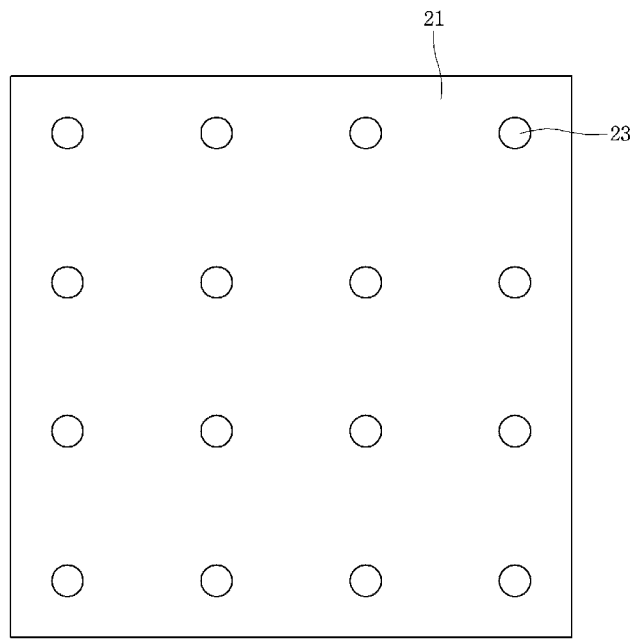
FIG. 2 is a sectional view taken along line A-A of FIG. 1.
Figure 3:
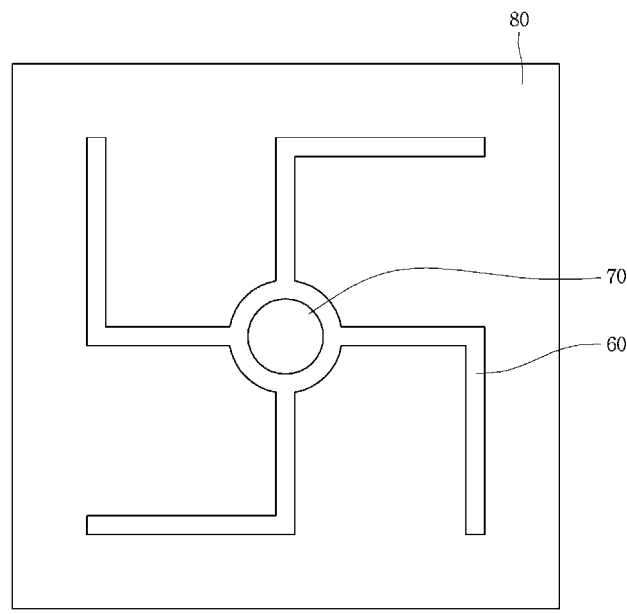
FIG. 3 is a view showing an example of a first electrode and an electrode pattern of the light emitting device of FIG. 1.

FIG. 1 is a sectional view showing a light emitting device according to the embodiment, FIG. 2 is a sectional view taken along line A-A of FIG. 1, and FIG. 3 is a view showing a first electrode and a pattern of the light emitting device of FIG. 1.

As shown in FIGS. 1 to 3, the light emitting device according to the embodiment may include a light emitting structure 10, a window semiconductor layer 15, a mirror layer 21, a conductive contact layer 23, a bonding layer 40, a support substrate 50, and a protective layer 80.

The light emitting structure 10 may include a first conductive semiconductor layer 11, an active layer 12, and a second conductive semiconductor layer 13. The active layer 12 may be disposed between the first and second conductive semiconductor layers 12 and 13. The active layer 12 may be disposed under the first conductive semiconductor layer 11, and the second conductive semiconductor layer 13 may be disposed under the active layer 12.

For example, the first conductive semiconductor layer 11 may include an n-type semiconductor layer doped with n-type dopants serving as first conductive dopants, and the second conductive semiconductor layer 13 may include a p-type semiconductor layer doped with p-type dopants serve as second conductive dopants. Alternatively, the first conductive semiconductor layer 11 may include a p-type semiconductor layer, and the second conductive semiconductor layer 13 may include an n-type semiconductor layer.

For example, the first conductive semiconductor layer 11 may include an n-type semiconductor. The first conductive semiconductor layer 11 may be realized using a compound semiconductor. For example, the first conductive semiconductor layer 11 may be realized using at least one of a compound semiconductor including a group II-VI element and a compound semiconductor including a group III-V element. For example, the first conductive semiconductor layer 11 includes a phosphorus (P)-based semiconductor, and may be realized using a semiconductor material having a compositional formula of $(Al_xGa_{1-x})_yIn_{1-y}P$ ($0 \leq x \leq 1$, $0 \leq y \leq 1$). The first conductive semiconductor layer 11 may have y of 0.5 and x in the range of 0.5 to 0.8 in the compositional formula. For example, the first conductive semiconductor layer 11 may include AlGaInP, AlInP, GaP, and GaInP and may be doped with n-type dopants such as Si, Ge, Sn, Se, and Te.

The active layer 12 emits light due to the energy band gap difference according to materials constituting the active layer 12 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure and a quantum wire structure, but the embodiment is not limited thereto.

For example, the active layer 12 may be realized by using a compound semiconductor. The active layer 12 may be realized using at least one of compound semiconductors including a group II-VI element and a group III-V element. The active layer 12 realized by using a semiconductor material having a compositional formula of $In_xAl_yGa_{1-x-y}N$ ($0 \leq x \leq 1$, $0 \leq y \leq 1$, $0 \leq x+y \leq 1$). The active layer 12 is a P-based semiconductor. For example, the active layer 12 may include AlGaInP, AlInP, GaP, or GaInP. When the active layer 12 has an MQW structure, the active layer 12 may be formed by stacking a plurality of well layers and a plurality of barrier layers. The active layer 12 may emit light having a peak wavelength in a red wavelength range, for example, light having a wavelength in the range of 600 nm to 630 nm.

For example, the second conductive semiconductor layer 13 may include a p-type semiconductor layer. The second conductive semiconductor layer 13 may be realized using a compound semiconductor. For example, the second conductive semiconductor layer 13 may be realized by using at least one of a compound semiconductor including a group II-VI element, and a compound semiconductor including a group III-V element. For example, the second conductive semiconductor layer 13 may be realized by using a semiconductor material having a compositional formula of $(Al_xGa_{1-x})_yIn_{1-y}P$ ($0 \leq x \leq 1$, $0 \leq y \leq 1$). The second conductive semiconductor layer 13 is a P-based semiconductor. For example, the second conductive semiconductor layer 13 may include AlGaInP, AlInP, GaP, or GaInP, and may be doped with a p-type dopant such as Mg, Zn, Ca, Sr, Ba, or C. For example, the light emitting structure 10 may be realized using at least two selected from the group consisting of aluminum (Al), gallium (Ga), indium (In) and phosphorus (P).

Meanwhile, the first conductive semiconductor layer 11 may include a p-type semiconductor layer and the second conductive semiconductor layer 13 may include the n-type semiconductor layer. In addition, a semiconductor layer including an n-type or p-type semiconductor layer may be additionally disposed under the second conductive semiconductor layer 13. Accordingly, the light emitting structure 10 may have at least one of an n-p junction structure, a p-n junction structure, an n-p-n junction structure and a p-n-p junction structure. Impurities may be doped into the first conductive semiconductor layer 11 and the second conductive semiconductor layer 13 with uniform or non-uniform doping concentration. In other words, the light emitting structure 10 may have various structures, but the embodiment is not limited thereto.

The light emitting device according to the embodiment may include the window semiconductor layer 15 including a semiconductor material. The window semiconductor layer 15 may be realized using a semiconductor material having a compositional formula of $(Al_xGa_{1-x})_yIn_{1-y}P$ ($0 \leq x \leq 1$, $0 \leq y \leq 1$). For example, the window semiconductor layer 15 may include one selected from the group consisting of AlGaInP, AlInP, GaP, and GaInP. The window semiconductor layer 15 may be disposed under the second conductive semiconductor layer 13. The window semiconductor layer 15 may serve as a conductive conductor to provide a current spreading effect.

The window semiconductor layer 15 according to the embodiment may include a carbon (C) as a p-type dopant. The dopant concentration of C may be higher than the concentration of dopants doped into the second conductive semiconductor layer 13. For example, the dopant concentration of C may be in the range of $5E18 \text{ cm}^{-3}$ to $1E20 \text{ cm}^{-3}$. The window semiconductor layer 15 may effectively spread current due to the high dopant concentration. In addition, the window semiconductor layer 15 may be disposed at thickness thicker than that of the second conductive semiconductor layer 13. The window semiconductor layer 15 may have a thickness T1 in the range of 0.2 μm to 0.5 μm, for example, may have the thickness T1 of 0.22 μm±0.02 μm. If the thickness of the window semiconductor layer 15 is thinner than the value in the range of the thickness T1, the current spreading effect may be deteriorated. If the thickness of the window semiconductor layer 15 exceeds the range of the thickness T1, light extraction efficiency may be degraded.

A lower outer portion 15A of the window semiconductor layer 15 may be disposed with a width wider than that of a top surface of the window semiconductor layer 15 to space the light emitting structure 10 apart from a reflective layer 30, so that a sidewall of the light emitting structure 10 can be protected.

The mirror layer 21, the conductive contact layer 23, the reflective layer 30, the bonding layer 40, and the support substrate 50 are disposed under the window semiconductor layer 15.

The mirror layer 21 is disposed under the light emitting structure 10 to reflect light incident from the light emitting structure 10 toward the light emitting structure 10. The mirror layer 21 includes a material having a refractive index lower than those of the light emitting structure 10 and the window semiconductor layer 15, and may include at least one of a low-refractive index layer, a metallic oxide layer, and a metallic nitride layer.

The mirror layer 21 includes at least one of a distributed Bragg reflector (DBR) layer and an omni directional reflector (ODR) layer.

The DBR layer has a structure formed by alternately providing two dielectric layers having mutually different refractive indexes. Each dielectric layer may include an oxide or a nitride including an element selected from the group consisting of Si, Zr, Ta, Ti, and Al. In detail, each dielectric layer may include $SiO_2$ layer, $Si_3N_4$ layer, $TiO_2$ layer, $Al_2O_3$ layer.

The ODR layer may have a structure including a metallic reflective layer and a low-refractive index layer formed on the metallic reflective layer. The metallic reflective layer may include Ag or Al, and the low-refractive index layer may include a transparent material such as $SiO_2$, $Si_3N_4$ or MgO.

According to another example, the mirror layer 21 may include at least one selected from the group consisting of ITO (Indium-Tin-Oxide), IZO (Indium-Zinc-Oxide), AZO (Aluminum-Zinc-Oxide), ATO (Antimony-Tin-Oxide), IZTO (Indium-Zinc-Tin-Oxide), IAZO (Indium-Aluminum-Zinc-Oxide), GZO (Gallium-Zinc-Oxide), IGZO (Indium-Gallium-Zinc-Oxide), IGTO (Indium-Gallium-Tin-Oxide), and AZO (Aluminum-Zinc-Oxide).

The conductive contact layer 23 may make contact with the window semiconductor layer 15, for example, ohmic-make contact with the window semiconductor layer 15. The conductive contact layer 23 may make contact with the window semiconductor layer 15 so that the conductive contact layer 23 may be electrically connected with the light emitting structure 10. As shown in FIG. 2, the conductive contact layer 23 includes a plurality of contact parts spaced apart from each other, and each contact part is formed through the mirror layer 21. Each contact part may have a dot shape, a circular shape, or a polygonal shape when viewed from the top, but the embodiment is not limited thereto.

The contact parts of the conductive contact layer 23 may be connected with each other by the reflective layer 30, and disposed in regions that are not overlapped with the first electrode 60 in a vertical direction. The mirror layer 21 may be disposed in regions that are overlapped with the first electrode 60 in the vertical direction. Accordingly, the mirror layer 21 blocks current supplied from the support substrate 50, and each contact part of the conductive contact layer 23 uniformly distributes and supplies current.

The conductive contact layer 23 may include a material different from that of the mirror layer 21. For example, the conductive contact layer 23 may include at least one selected from the group consisting of Au, Au/AuBe/Au, AuZn, ITO (Indium-Tin-Oxide), AuBe, GeAu, IZO (Indium-Zinc-Oxide), AZO (Aluminum-Zinc-Oxide), ATO (Antimony-Tin-Oxide), IZTO (Indium-Zinc-Tin-Oxide), IAZO (Indium-Aluminum-Zinc-Oxide), GZO (Gallium-Zinc-Oxide), IGZO (Indium-Gallium-Zinc-Oxide), IGTO (Indium-Gallium-Tin-Oxide), and AZO (Aluminum-Zinc-Oxide). In other words, the mirror layer 21 or the conductive contact layer 23 may include a nitride or an oxide having a refractive index lower than that of the window semiconductor layer 15.

The conductive contact layer 23 may have a thickness h thinner than the thickness T1 of the window semiconductor layer 15. For example, the conductive contact layer 23 may have a thickness which is a range of ⅓ or less of the thickness T1 of the window semiconductor layer 15. The thickness h of the conductive contact layer 23 may be in the range of 10 nm to 100 nm, for example, in the range of 10 nm or 80 nm. For example, if the thickness h of the conductive contact layer 23 exceeds the range, the light absorption efficiency may be increased, so that the light transmittance and the light quantity may be degraded. In addition, if the conductive contact layer 23 has an excessively thin thickness, the material of the reflective layer 30 may be diffused, and the electrical characteristic may be degraded.

On the assumption that the wavelength generated by the active layer 12 is λ and the refractive index of the conductive contact layer 23 is n, the thickness h of the conductive contact layer 23 may be found as expressed in Equation 1.

$$4\pi n/\lambda \times h + \phi = 2\pi \text{ is satisfied, } \phi \text{ denotes a weighted value, and the range of } \phi \text{ is } \pi < \phi < 3\pi/2.$$  Equation 1

Accordingly, the thickness h may satisfy λ/8n<h<λ/4n. For example, if the conductive contact layer 23 includes ITO, the refractive index may be 2.0. If λ is in the range of 600 nm to 630 nm, the thickness h of the conductive contact layer 23 may be in the range of 37 nm to 78 nm. The refractive index of the ITO may be in the range of 1.9 to 2.1, but the embodiment is not limited thereto.

Figure 9:
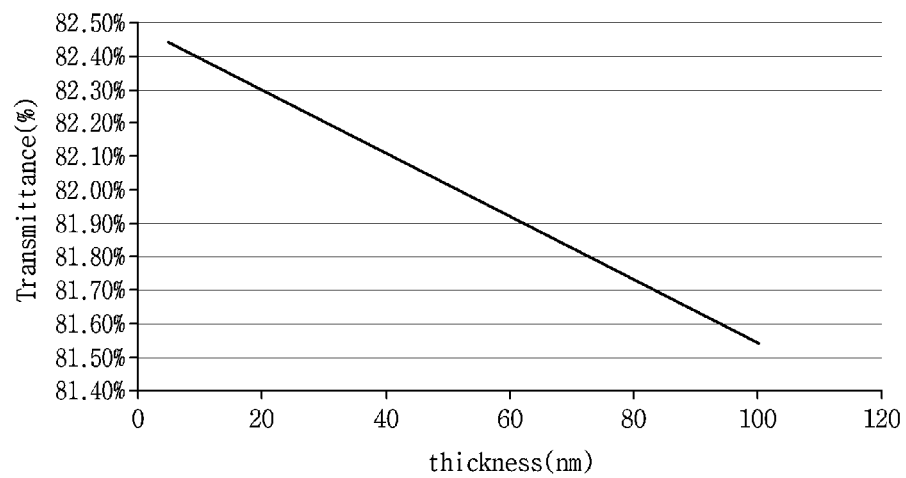
FIG. 9 is a graph showing transmittance as a function of the thickness of a conductive contact layer applied to the light emitting device of FIG. 1.
Figure 10:
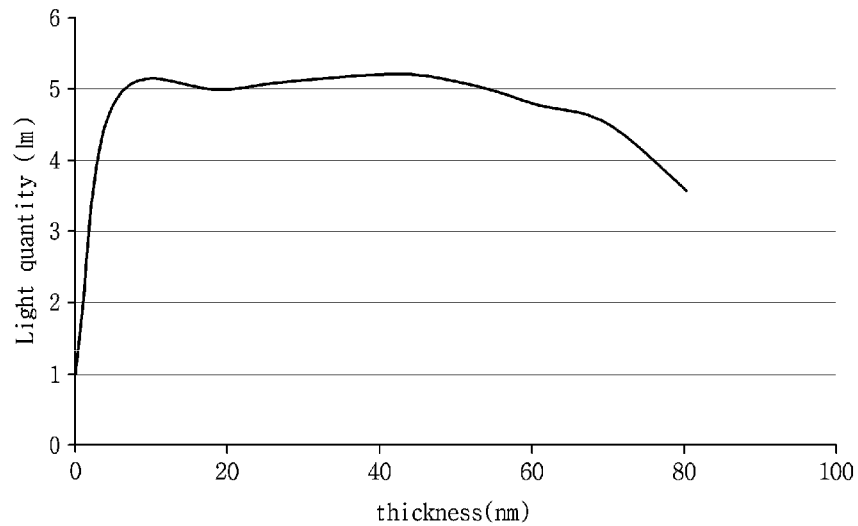
FIG. 10 is a graph showing a light quantity as a function of the thickness of the conductive contact layer applied to the light emitting device of FIG. 1.

As shown in the graph of FIG. 9, regarding the transmittance as a function of a thickness of an ITO layer, as the thickness of the ITO layer is increased, the light transmittance is decreased. Regarding the light quantity as a function of the ITO thickness as shown in FIG. 10, if the thickness of the ITO layer is out of the range of 10 nm to 78 nm, the light quantity is significantly lowered. Accordingly, when taking into consideration the light transmittance of FIG. 9 and the light quantity of FIG. 10, when the thickness of the ITO layer is in the range of 37 nm to 78 nm, satisfactory light transmittance and light quantity can be obtained.

The reflective layer 30 is disposed under the conductive contact layer 23, and the mirror layer to reflect light incident through the conductive contact layer 23. The reflective layer 30 connects patterns of the conductive contact layer 23 with each other. For example, the reflective layer 30 may include at least one selected from the group consisting of Ag, Au, and Al.

The bonding layer 40 bonds the reflective layer 30 to the support substrate 50. For example, the bonding layer 40 may include at least one selected from the group consisting of Sn, AuSn, Pd, Al, Ti, Au, Ni, Cr, Ga, In, Bi, Cu, Ag, Nb, Ta, and Ti/Au/In/Au.

The support substrate 50 may include a material having conductivity, and may serve as a support layer. The support substrate 50 may include at least one selected from the group consisting of Ti, Cr, Ni, Al, Pt, Au, W, Cu, Mo, Cu—W, and a semiconductor substrate (e.g., Si, Ge, GaN, GaAs, ZnO, SiC, and SiGe) doped with impurities. The support substrate 50 may have the thickness in the range of 30 μm to 300 μm. The support substrate 50 may have the thickness occupying more than 80% of the thickness formed from the conductive contact layer 23 to the support substrate 50.

The light emitting device according to the embodiment may include the first electrode 60 and an electrode pad 70 formed on the light emitting structure 10.

The first electrode 60 may be electrically connected with the first conductive semiconductor layer 11. The first electrode 60 may make contact with the first conductive semiconductor layer 11. The first electrode 60 may make ohmic-contact with the first conductive semiconductor layer 11. The first electrode 60 may include a region making ohmic-contact with the light emitting structure 10. The first electrode 60 may include a region making ohmic-contact with the first conductive semiconductor layer 11. The first electrode 60 may include at least one selected from the group consisting of Ge, Zn, Mg, Ca, Au, Ni, AuGe, and AuGe/Ni/Au. As shown in FIG. 3, the first electrode 60 may have arm patterns branching in mutually different directions.

The electrode pad 70 may be electrically connected with the first electrode 60. The electrode pad 70 may be disposed on the first electrode 60. The electrode pad 70 may be disposed on the first electrode 60 while contacted with the electrode 60. The electrode pad 70 may be connected with an external power source to supply power to the light emitting structure 10. The electrode pad 70 may include at least one selected from the group consisting of Cr, V, W, Ti, Zn, Ni, Cu, Al, Au, Mo, Ti/Au/Ti/Pt/Au, Ni/Au/Ti/Pt/Au, and Cr/Al/Ni/Cu/Ni/Au.

The light emitting device according to the embodiment may include the protective layer 80. The protective layer 80 may be disposed on the light emitting structure 10. The protective layer 80 may be disposed at a peripheral portion of the light emitting structure 10. The protective layer 80 may be disposed at a lateral side of the light emitting structure 10. The protective layer 80 may be disposed at a peripheral portion of the window semiconductor layer 15. A portion of the protective layer 80 may be disposed on a portion of the window semiconductor layer 15.

The protective layer 80 may be disposed on the first conductive semiconductor layer 11. The protective layer 80 may be disposed on the first electrode 60. The protective layer 80 may include a light extraction structure R disposed on a top surface thereof. The light extraction structure R may be called an unevenness structure or a roughness. The light extraction structure R may have a uniform arrangement structure, or a random arrangement structure.

According to the embodiment, the first conductive semiconductor layer 11 may have a flat top surface, and the light extracting structure R may be disposed in the protective layer 80. In other words, the light extraction structure R may not be disposed on the top surface the first conductive semiconductor layer 11, but may be disposed only on the protective layer 80.

The protective layer 80 may include at least one of an oxide or a nitride. The protective layer 80 may include at least selected from the group consisting of $SiO_2$, $Si_xO_y$, $Si_3N_4$, $Si_xN_y$, $SiO_xN_y$, $Al_2O_3$, $TiO_2$, and AlN.

The protective layer 80 may be realized with the thickness in the range of 1 μm to 2 μm. The protective layer 80 may be realized with the refractive index lower than that of the first conductive semiconductor layer 11. The protective layer 80 is realized with the difference in refractive index from the first conductive semiconductor layer 11, so that the light extraction efficiency can be improved due to the difference in the refractive index.

For example, the wavelength of light emitted from the active layer 12 may be in a red wavelength range, the thickness of the first conductive semiconductor layer 11 may be in the range of 1 μm to 1.5 μm, and the thickness of the protective layer 80 may be disposed with the thickness thicker than that of the first conductive semiconductor layer 11. For example, the first conductive semiconductor layer 11 may be realized with a composition of AlGaInP, and the wavelength of the light emitted from the active layer 12 may be realized in the range of 600 nm to 630 nm.

The light extraction structure disposed in the protective layer 80 may be formed at a pattern having a micro-meter height or a nano-meter height.

Meanwhile, power can be applied to the light emitting structure 10 from the external power source connected with the support substrate 50 and the first electrode pad 70. Power can be supplied to the second conductive semiconductor layer 13 through the support substrate 50.

In addition, according to the embodiment, a second electrode electrically connected with the second conductive semiconductor layer 13 may be defined by the conductive contact layer 23, the reflective layer 30, the bonding layer 40, and the support substrate 50.

Figure 4:
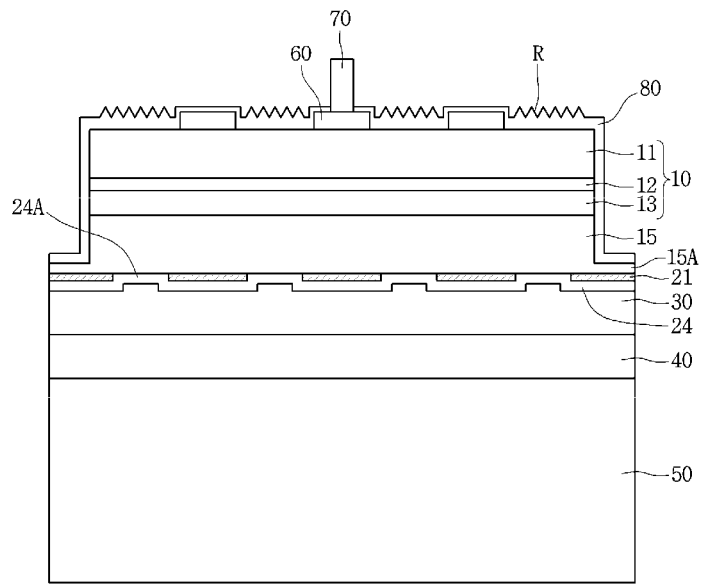
FIG. 4 is a sectional view showing another example of a light emitting device shown in FIG. 1.

FIG. 4 is a sectional view showing another example of the light emitting device shown in FIG. 1. In the following description referring to FIG. 4, those skilled in the art can understand the description of the same structure and elements as those of FIG. 1 by making reference to the description of the structure and elements of FIG. 1.

Referring to FIG. 4, the light emitting device may include the light emitting structure 10, the window semiconductor layer 15, the mirror layer 21, a conductive contact layer 24, the bonding layer 40, the support substrate 50, and the protective layer 80.

The window semiconductor layer 15 may include a GaP-based semiconductor disposed under the light emitting structure 10, and may include carbon (C) serving as a p-type dopant. The window semiconductor layer 15 may spread current.

The mirror layer 21 is disposed under the window semiconductor layer 15, and the conductive contact layer 24 is disposed between the mirror layer 21 and the reflective layer 30. The conductive contact layer 24 is disposed under the entire portion of the mirror layer 21 and includes a plurality of contact parts 24A. The contact parts 24A are formed through the mirror layer 21 while being spaced apart from each other. The contact parts 24A of the conductive contact layer 24 are disposed in mutually different regions, and disposed in regions that are not overlapped with the first electrode 60 in the vertical direction. In addition, the mirror layer 21 is overlapped with the first electrode 60 in the vertical direction to block current. A bottom surface of the conductive contact layer 24 may have an unevenness structure. The unevenness structure can improve the adhesion strength with the reflective layer 30 and the reflective efficiency.

Figure 5:
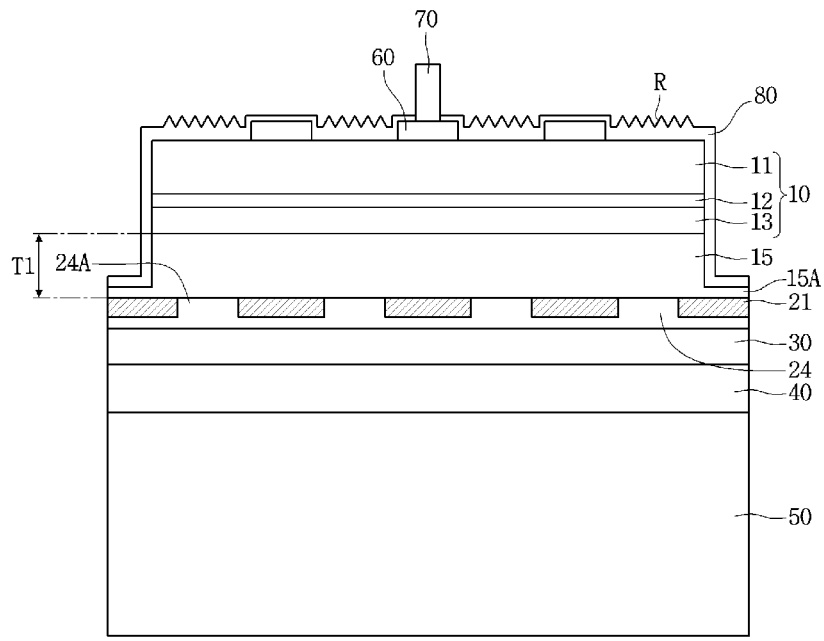
FIG. 5 is a sectional view showing a light emitting device according to the second embodiment.
Figure 6:
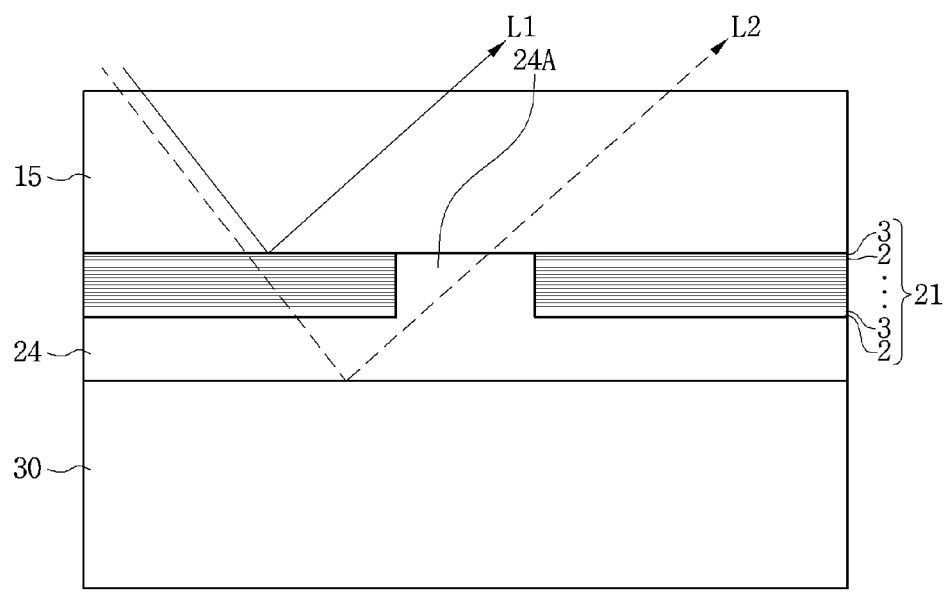
FIG. 6 is a sectional view showing a reflective layer and a conductive contact layer in the light emitting device of FIG. 5.

FIG. 5 is a sectional view showing a light emitting device according to the second embodiment, FIG. 6 is a sectional view showing a mirror layer and a conductive contact layer in the light emitting device of FIG. 5. The configuration according to the second embodiment may include the configuration described in the above disclosed embodiment.

As shown in FIGS. 5 and 6, the light emitting device according to the embodiment may include the light emitting structure 10, the window semiconductor layer 15, the mirror layer 21, the conductive contact layer 24, the reflective layer 30, the bonding layer 40, the support substrate 50, and the protective layer 80.

The light emitting structure 10 may include the first conductive semiconductor layer 11, the active layer 12, and the second conductive semiconductor layer 13. The active layer 12 may be disposed between the first and second conductive semiconductor layers 12 and 13. The active layer 12 may be disposed under the first conductive semiconductor layer 11, and the second conductive semiconductor layer 13 may be disposed under the active layer 12.

The mirror layer 21 is disposed under the light emitting structure 10 to reflect light incident from the light emitting structure 10 toward the light emitting structure 10. The mirror layer 21 includes a material having a refractive index lower than those of the light emitting structure 10 and the window semiconductor layer 15, and may include at least one of a low-refractive index layer, a metallic oxide layer, and a metallic nitride layer.

As shown in FIG. 6, the mirror layer 21 may have the DBR structure. The DBR structure has a structure formed by alternately providing first and second dielectric layers 2 and 3 having mutually different refractive indexes. Each of the first and second dielectric layers 2 and 3 may include an oxide or a nitride including an element selected from the group consisting of Si, Zr, Ta, Ti, and Al. In detail, the first and second dielectric layers 2 and 3 may include mutually different layers, which are selected from among $SiO_2$ layer, $Si_3N_4$ layer, $TiO_2$ layer, $Al_2O_3$ layer, and an MgO layer respectively. Each of the first and second dielectric layers 2 and 3 may have the thickness of $\lambda/4n$, the $\lambda$ represents a wavelength of light emitted from the active layer 12, and the n represents the refractive indexes of the first and second dielectric layers 2 and 3. The first and second dielectric layers 2 and 3 may be formed in a two-pair to 30-pair structure, but the embodiment is not limited thereto.

An outer portion of the mirror layer 21 may be disposed under an outer portion 14A of the window semiconductor layer 15 to reflect light incident through the window semiconductor layer 15.

The conductive contact layer 24 is disposed between the mirror layer 21 and the reflective layer 30. The conductive contact layer 24 is realized to make contact with the window semiconductor layer 15, for example, to make ohmic-contact with the window semiconductor layer 15. The conductive contact layer 24 may make contact with the window semiconductor layer 15 so that the conductive contact layer 23 may be electrically connected with the light emitting structure 10. As shown in FIG. 2, the contact parts 24A of the conductive contact layer 23 may be spaced apart from each other, and may be formed through the mirror layer 21. The contact part 24A of the conductive contact layer 24 may have a dot shape, or a circular shape when viewed from the top, but the embodiment is not limited thereto.

The contact parts 24A of the conductive contact layer 24 are connected with each other by the reflective layer 30, and disposed in regions that are not overlapped with the first electrode 60 in the vertical direction. The mirror layer 21 may be disposed at regions that are overlapped with the first electrode 60 in the vertical direction. Accordingly, the mirror layer 21 blocks current supplied from the support substrate 50, and each contact part 24A of the conductive contact layer 24 uniformly distributes and supplies current.

The conductive contact layer 24 may serve as a low-refractive index layer having the refractive index of 2.1 or less. The conductive contact layer 24 may include a transmissive metal oxide having a refractive index lower than that of the window semiconductor layer 15. The conductive contact layer 24 may include a material representing more than 80% of transmittance, and may include a material different from that of the mirror layer 21. For example, the conductive contact layer 24 may include at least one selected from the group consisting of ITO (Indium-Tin-Oxide), IZO (Indium-Zinc-Oxide), AZO (Aluminum-Zinc-Oxide), ATO (Antimony-Tin-Oxide), IZTO (Indium-Zinc-Tin-Oxide), IAZO (Indium-Aluminum-Zinc-Oxide), GZO (Gallium-Zinc-Oxide), IGZO (Indium-Gallium-Zinc-Oxide), IGTO (Indium-Gallium-Tin-Oxide), and AZO (Aluminum-Zinc-Oxide).

The conductive contact layer 24 may have the thickness thinner than the thickness T1 of the window semiconductor layer 15. For example, the conductive contact layer 24 may have the thickness which is a range of ⅓ or less of the thickness T1 of the window semiconductor layer 15.

The reflective layer 30 is disposed under the conductive contact layer 24, and makes contact with the bottom surface of the conductive contact layer 24.

The conductive contact layer 24 and the reflective layer 30 may be laminated on each other in the ODR structure. The ODR structure may be a structure in which the conductive contact layer 24 serving as the low-refractive index layer and the reflective layer 30 including a metallic material serving as a high reflective material may be laminated on each other. For example, the ODR structure may be a lamination structure of Ag/ITO. An omni-directional reflection angle on the interfacial surface between the conductive contact layer 24 and the reflective layer 30 can be improved. In addition, the DBR structure and the ODR structure are disposed under the window semiconductor layer 15, so that a reflective characteristic can be improved with respect to a transverse electric (TE)-transverse magnetic (TM) polarization to improve the light extraction efficiency. Therefore, the light emitting device having almost 90% or more of the light reflectance can be disposed in the red wavelength range.

The light emitting device according to the embodiment may include the first electrode 60 and the electrode pad 70 disposed on the light emitting structure 10. As shown in FIG. 3, the first electrode 60 may have arm patterns branching in mutually different directions and connected with each other.

Figure 7:
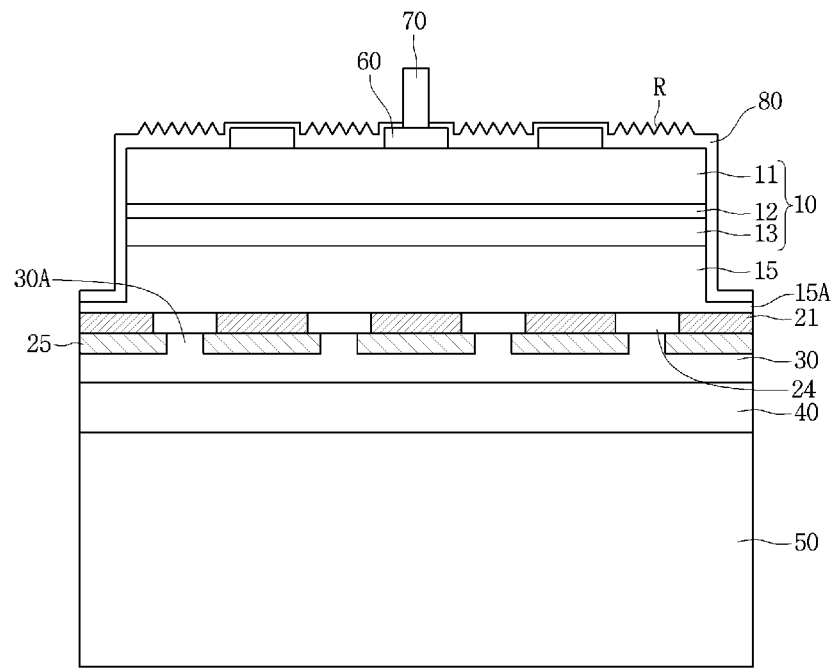
FIG. 7 is a sectional view showing another example of the light emitting device of FIG. 5.

FIG. 7 is a sectional view showing another example of the light emitting device of FIG. 5. In the following description referring to FIG. 7, the same configuration as that of the above disclosed embodiment will be described by making reference to the description of the above disclosed configuration.

Referring to FIG. 7, the light emitting device may include light emitting structure 10, the window semiconductor layer 15, the mirror layer 21, the conductive contact layer 24, a low-refractive layer 25, the reflective layer 30, the bonding layer 40, the support substrate 50, and the protective layer 80.

The window semiconductor layer 15 may include a GaP-based semiconductor disposed under the light emitting structure 10, and may include carbon (C) serving as a p-type dopant. The window semiconductor layer 15 may spread current.

The mirror layer 21 is disposed under the window semiconductor layer 15, and the conductive contact layer 24 is disposed between the mirror layer 21 and the reflective layer 30. Conductive contact layers 24 are formed through the mirror layer 21 and spaced apart from each other. The conductive contact layers 24 are disposed in mutually different regions that are not overlapped with the first electrode 60 in the vertical direction. In addition, the mirror layer 21 is overlapped with the first electrode 60 in the vertical direction to block current.

As shown in FIG. 6, the mirror layer 21 has a DBR structure, and has a thickness equal to or thicker than that of the conductive contact layer 24. The low-refractive index layer 25 is disposed between the mirror layer 21 and the reflective layer 30 and includes a material different from materials of the first and second dielectric layers 2 and 3 of the mirror layer 21. The low-refractive index layer 25 may have a refractive index lower than that of the window semiconductor layer 15. The low-refractive index layer 25 may include a material which is selected from among $SiO_2$ layer, $Si_3N_4$ layer, $TiO_2$ layer, $Al_2O_3$ layer, and MgO layer and different from those of the first and second dielectric layers 2 and 3. In addition, the low-refractive index layer 25 may include a material different from that of the conductive contact layer 24. For example, the low-refractive index layer 25 may include one of ITO, IZO, AZO, ATO, IZTO, IAZO, GZO, IGZO, IGTO, and AZO. In other words, the low-refractive index layer 25 may include a material different from that of the conductive contact layer 24 and the mirror layer 21. For example, the low-refractive index layer 25 may include a conductive oxide material or an insulating oxide material.

A portion of the low-refractive index layer 25 may make contact with a portion of a bottom surface of the conductive contact layer 24, but the embodiment is not limited thereto. The low-refractive index layer 25 may have a thickness thinker than those of the first and second dielectric layers 2 and 3 of the mirror layer 21 of FIG. 6.

The reflective layer 30 may include a plurality of contact parts 30A, and may make contact with the conductive contact layer 24. Accordingly, the conductive contact layer 24 may be electrically connected with the low-refractive index layer 25 through the reflective layer 30.

The reflective layer 30 and the low-refractive index layer 25 may be laminated in the ODR layer structure.

Figure 8:
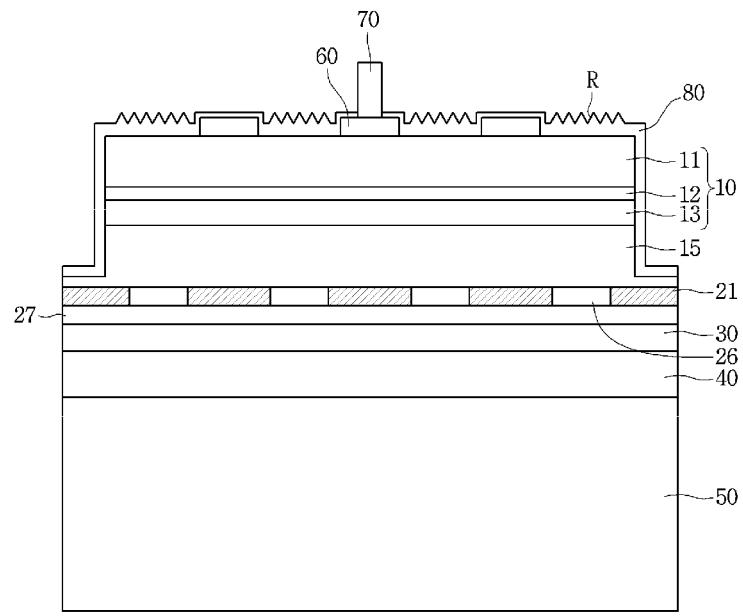
FIG. 8 is a sectional view showing another example of the light emitting device of FIG. 5.

FIG. 8 is a sectional view showing another example of the light emitting device of FIG. 5. In the following description referring to FIG. 8, the same configuration as the above disclosed configuration will be described by making reference to the description of the above disclosed configuration.

Referring to FIG. 8, the light emitting device according to the embodiment may include the light emitting structure 10, the window semiconductor layer 15, the mirror layer 21, a conductive contact layer 26, a low-refractive index layer 27, the reflective layer 30, the bonding layer 40, the support substrate 50, and the protective layer 80.

The window semiconductor layer 15 is a GaP-based semiconductor disposed under the light emitting structure 10, and may include C serving as a p-type dopant. The window semiconductor layer 15 may spread current.

The mirror layer 21 is disposed under the window semiconductor layer 15, and the conductive contact layer 26 and the low-refractive index layer 27 are disposed between the mirror layer 21 and the reflective layer 30. The conductive contact layer 26 is formed through the mirror layer 21 and spaced apart from each other. Conductive contact layers 26 are disposed in mutually different regions that are not overlapped with the first electrode 60 in the vertical direction. In addition, the mirror layer 21 is overlapped with the first electrode 60 in the vertical direction to block current.

As shown in FIG. 6, the mirror layer 21 has a DBR structure, and has a thickness equal to or thicker than that of the conductive contact layer 26.

The conductive contact layer 26 includes metal or non-metal. For example, the conductive contact layer 26 includes at least one of Au, Au/AuBe/Au, AuZn, ITO, AuBe, GeAu, IZO, AZO, ATO, IZTO, IAZO, GZO, IGZ, IGTO, and AZO. The conductive contact layer 26 may be formed in the range of 10 nm to 100 nm.

The low-refractive index layer 27 may be disposed between both of the mirror layer 21 and the conductive contact layer 26, and the reflective layer 300, and may include a material different from that of the conductive contact layer 26. For example, the low-refractive index layer 27 may include one of ITO, IZO, AZO, ATO, IZTO, IAZO, GZO, IGZO, IGTO, and AZO. In addition, the low-refractive index layer 27 may include a material having a refractive index lower than that of the window semiconductor layer 15. For example, the low-refractive index layer 27 may include a conductive oxide or a conductive nitride.

A top surface of the low-refractive index layer 27 makes contact with a bottom surfaces of both of the conductive contact layer 26 and the mirror layer 21, and a bottom surface of the low-refractive index layer 27 makes contact with a top surface of the reflective layer 30. The low-refractive index layer 27 may have a thickness thicker than that of each of the first and second dielectric layers 2 and 3 of the mirror layer 21 of FIG. 6.

The reflective layer 30 and the low-refractive index layer 27 may be laminated on each other in the ODR layer structure.

Meanwhile, according to the embodiment, the conductive contact layer 26 may have a thickness thinner than the thickness T1 of the window semiconductor layer 15. For example, the conductive contact layer 26 may have the thickness which is a range of ⅓ or less of the thickness T1 of the window semiconductor layer 15. The thickness h of the conductive contact layer 26 may be in the range of 10 nm to 100 nm. For example, if the thickness of the conductive contact layer 23 exceeds the range, the light absorption efficiency may be increased, so that the light transmittance and the light quantity may be degraded. In addition, if the conductive contact layer 26 has an excessively thin thickness, the material of the reflective layer 30 may be diffused, and the electrical characteristic may be degraded.

Figure 11:
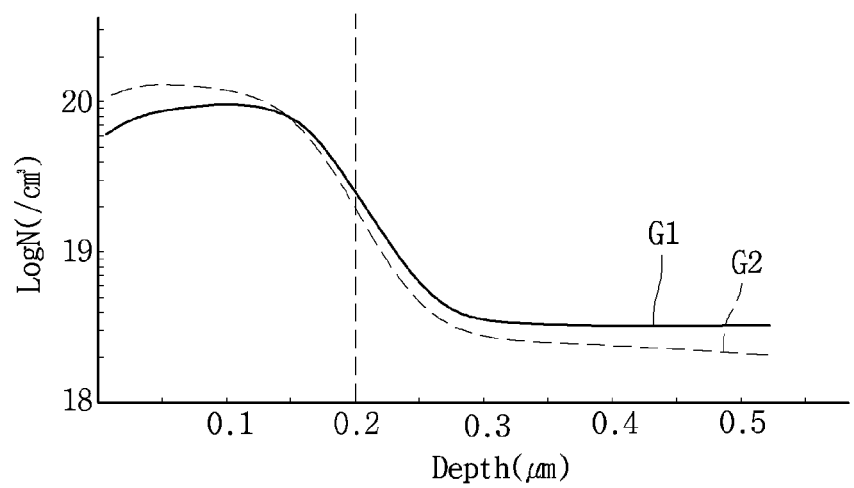
FIG. 11 is a graph showing carrier concentration in a p-type GaP layer according to the comparative example.

FIG. 11 is a graph showing a carrier density in a p-type GaP according to a comparative example. In this case, Mg is doped on the p-type GaP layer according to the comparative example, and a bottom surface of the p-type GaP layer includes a metallic contact layer formed through an alloying process for ohmic contact. In this case, according to the alloying process, a portion of dopants is diffused to the p-type GaP layer to increase the carrier density in the p-type GaP. In this case, the carrier density increases the absorption of light into the p-type GaP due to a scattering effect. For example, as shown in experimental example G1 and G2 shown in the graph of FIG. 11, the carrier density is increased to the depth of less than 0.2 μm by the dopants diffused into the p-type GaP layer, and decreased at the depth of 0.2 µm or more. In this case, the depth is a distance from the metallic contact layer to a predetermined region of the p-type GaP layer. Differently from the comparative example, according to the embodiment, in order to prevent dopants from being diffused in the p-type GaP layer, the window semiconductor layer 15 is disposed with a thick thickness, and a transparent conductive contact layer 26 is laminated under the window semiconductor layer 15 instead of the metallic material. In addition, the thickness T1 of the window semiconductor layer 15 may be 0.2 µm or more to cover the diffusion of the dopants. In addition, the contact resistance with the conductive contact layer 23 may be lowered due to the high-density window semiconductor layer 15.

Figure 12:
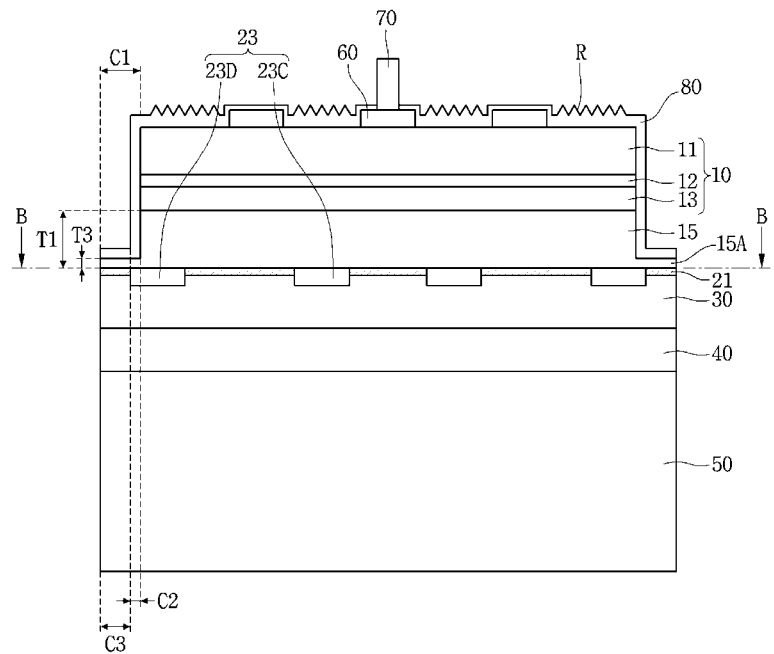
FIG. 12 is a view showing a light emitting device according to the third embodiment.
Figure 13:
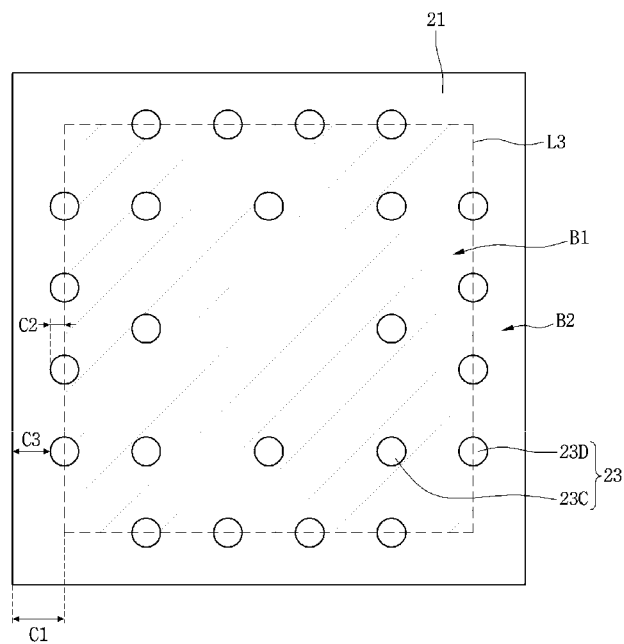
FIG. 13 is a sectional view taken along line B-B of the light emitting device of FIG. 12.
Figure 14:
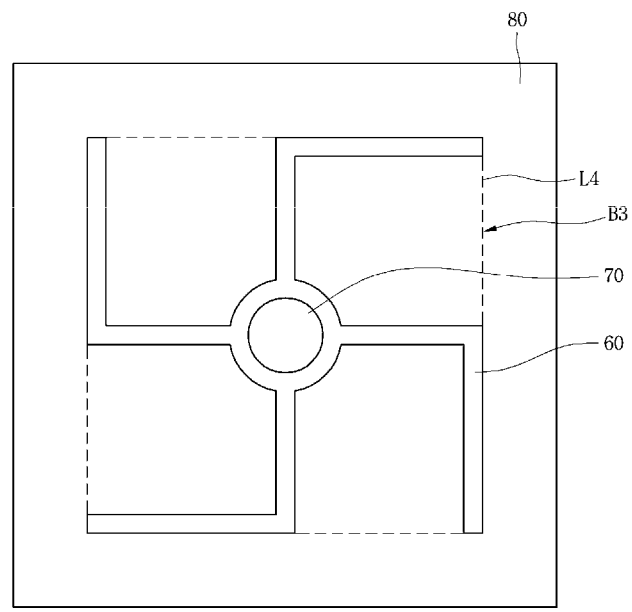
FIG. 14 is a view showing a first electrode and an electrode pattern of the light emitting device of FIG. 13.

FIG. 12 is a sectional view showing a light emitting device according to the third embodiment, and FIG. 13 is a sectional view taken along line B-B of the light emitting device. FIG. 14 is a view showing the first electrode and the pattern of the light emitting device of FIG. 12. In the following description of the third embodiment, the same configuration as the above disclosed configuration will be described by making reference to the description of the above disclosed configuration.

As shown in FIGS. 12 to 14, the light emitting device according to the embodiment may include the light emitting structure 10, the window semiconductor layer 15, the mirror layer 21, the conductive contact layer 23, the reflective layer 30, the bonding layer 40, the support substrate 50, and the protective layer 80.

The light emitting structure 10 may include the first conductive semiconductor layer 11, the active layer 12, and the second conductive semiconductor layer 13. The active layer 12 may be disposed between the first conductive semiconductor layer 11 and the second conductive semiconductor layer 13. The active layer 12 may be disposed under the first conductive semiconductor layer 11, and the second conductive semiconductor layer 13 may be disposed under the active layer 12.

The window semiconductor layer 15 according to the embodiment may include a carbon (C) as a p-type dopant. The dopant concentration of C may be higher than the concentration of dopants doped into the second conductive semiconductor layer 13. For example, the dopant concentration of C may be in the range of $5E18$ $cm^{-3}$ to $1E20$ $cm^{-3}$. The window semiconductor layer 15 may effectively spread current due to the high dopant concentration. In addition, the window semiconductor layer 15 may be disposed at thickness thicker than that of the second conductive semiconductor layer 13. The window semiconductor layer 15 may have a thickness T1 in the range of 0.2 µm to 0.5 µm, for example, may have the thickness T1 of 0.22 µm±0.02 µm. If the thickness of the window semiconductor layer 15 is thinner than the value in the range of the thickness T1, the current spreading effect may be deteriorated. If the thickness of the window semiconductor layer 15 exceeds the range of the thickness T1, light extraction efficiency may be degraded.

A bottom surface width may be wider than a top surface width of the window semiconductor layer 15, and may be equal to a top surface width of the reflective layer 30. A lower outer portion 15A disposed at a lower peripheral portion of the window semiconductor layer 15 may protrude outward from a sidewall of the light emitting structure 10. Accordingly, the outer portion 15A of the window semiconductor layer 15 may space the light emitting structure 10 apart from the reflective layer 30 to protect the sidewall of the light emitting structure 10. A thickness T3 of the outer portion 15A of the window semiconductor layer 15 may be ½ or less of the thickness T1. In addition, the outer portion 15A of the window semiconductor layer 15 is not overlapped with the light emitting structure 10 in the vertical direction and has a width C1. The width C1 may be 20 µm or more, but the embodiment is not limited thereto. The width C1 of the outer portion 15A of the window semiconductor layer 15 may be greater than a distance C3 between the conductive contact layer 23 and the sidewall of the reflective layer 30.

The mirror layer 21, the conductive contact layer 23, the reflective layer 30, the bonding layer 40, and the support substrate 50 are disposed under the window semiconductor layer 15.

The mirror layer 21 is disposed under the light emitting structure 10 to reflect light incident from the light emitting structure 10 toward the light emitting structure 10.

The conductive contact layer 23 may make contact with the window semiconductor layer 15, for example, ohmic-make contact with the window semiconductor layer 15. The conductive contact layer 23 may make contact with the window semiconductor layer 15 so that the conductive contact layer 23 may be electrically connected with the light emitting structure 10. As shown in FIG. 13, the conductive contact layer 23 includes a plurality of contact parts spaced apart from each other, and each contact part is formed through the mirror layer 21. Each contact part may have a dot shape, a circular shape, or a polygonal shape when viewed from the top, but the embodiment is not limited thereto.

The conductive contact layer 23 may have a thickness thinner than the thickness T1 of the window semiconductor layer 15. For example, the conductive contact layer 23 may have the thickness which is a range of ⅓ or less of the thickness T1 of the window semiconductor layer 15. The thickness of the conductive contact layer 23 may be in the range of 10 nm to 100 nm, for example, the range of 10 nm to 80 nm. For example, if the thickness of the conductive contact layer 23 exceeds the range, the light absorption efficiency may be increased, so that the light transmittance and the light quantity may be degraded. In addition, if the conductive contact layer 23 has an excessively thin thickness, the material of the reflective layer 30 may be diffused, and the electrical characteristic may be degraded.

Referring to FIGS. 13 and 14, the conductive contact layer 23 includes a plurality of first contact parts 23C having top surfaces entirely overlapped with the light emitting structure 10 in the vertical direction and a plurality of second contact parts 23D having top surfaces partially disposed outward from the sidewall of the light emitting structure 10. The first and second contact parts 23C and 23D are disposed at regions except that the electrode pad 70 is overlapped with the first electrode 60 in the vertical direction.

The conductive contact layer 23 includes a first region B1 disposed inside a sidewall line L3 of the light emitting structure 10 and a second region B2 disposed outside of the first contact part 23C. The first contact part 23C is disposed in the first region B1, and the second contact part 23D protrudes outward from the boundary line L3 between the first and second regions B1 and B2. The boundary line L3 may serve as a sidewall line of the light emitting structure 10 or a sidewall line of the active layer 12.

In addition, the first contact part 23C is disposed inward from the line L4 to connect outlines L4 of the first electrode 60 with each other or a third region B3 disposed inside the line L4, and a portion or the entire portion of the second contact part 23D may be disposed outward from the line L4 or the third region B3. Therefore, as the window semiconductor layer 15 makes contact with the second contact part 23D of the conductive contact layer 23, current may be supplied even to an outer portion of the active layer 12. Accordingly, the internal quantum efficiency of the active layer 12 can be improved.

Referring to FIGS. 12 and 13, second contact parts 23D of the conductive contact layer 23 may be arranged in number which is a range of 30% to 60% of the total number of the first and second contact parts 23C and 23D or may have an area occupied by 30% to 60% of the total area of the first and second contact parts 23C and 23D. Therefore, current can be supplied to a region adjacent to an edge of the active layer 12 as well as the inner region of the active layer 12. The second contact part 23D may have a top region narrower than that of the first contact part 23C, but the embodiment is not limited thereto.

In addition, the second contact part 23D of the conductive contact layer 23 may protrude outward of the boundary line L3 of the light emitting structure 10 by a predetermined length C2, and may be disposed at an inside of the outer portion of the mirror layer 21. The length C2 is less than or may be less than the width of each of the contact parts 23C and 23D, and may be in the range of 12 μm to 18 μm. When the length C2 of the protruding portion of each of the contact parts 23C and 23D is less than the range, power or current may not be spread. When the length C2 is greater than the range, the electrical characteristic may be more degraded as compared with the improvement degree of the internal quantum efficiency. According to the embodiment, the second contact part 23D of the conductive contact layer 23 is spaced apart from the edge of the mirror layer 21 to prevent the electrical characteristic from being degraded when the conductive contact layer 23 including a metallic material such as AuBe or AuZn is adjacent to the sidewall or exposed to the sidewall.

Figure 15:
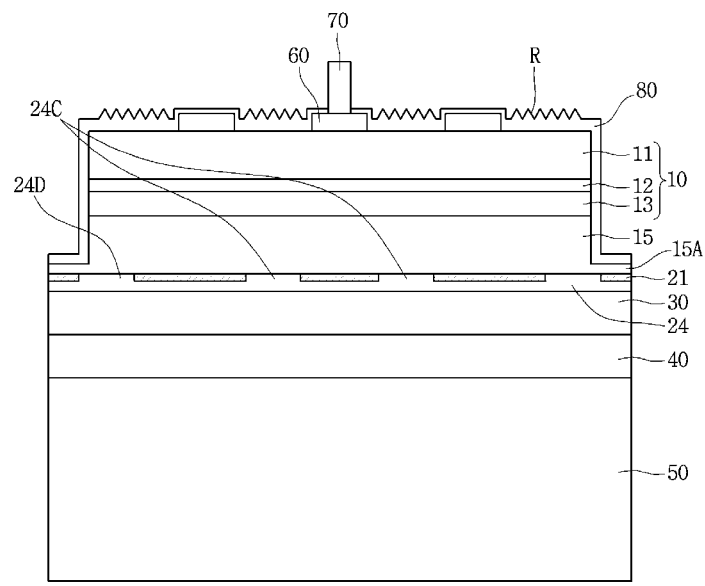
FIG. 15 is a sectional view showing another example of the light emitting device of FIG. 12.

FIG. 15 is a sectional view showing another example of the light emitting device of FIG. 12. In the following description referring to FIG. 12, the same configuration as those of the above disclosed embodiments will be described by making reference to the description of those of the above disclosed embodiments.

Referring to FIG. 15, the light emitting device may include light emitting structure 10, the window semiconductor layer 15, the mirror layer 21, the conductive contact layer 24, the reflective layer 30, the bonding layer 40, the support substrate 50, and the protective layer 80.

The conductive contact layer 24 is disposed under an entire portion of the mirror layer 21, and includes a plurality of contact parts 24C and 24D. The contact parts 24C and 24D are formed through the mirror layer 21 while being spaced apart from each other. The contact parts 24C and 24D of the conductive contact layer 24 are disposed in mutually different regions that are not overlapped with the first electrode 60 in the vertical direction. The mirror layer 21 is overlapped with the first electrode 60 in the vertical direction to block current. A bottom surface of the conductive contact layer 24 may have an unevenness structure. The unevenness structure may improve the adhesive strength and the reflective efficiency with the reflective layer 30.

An entire portion of the first contact part 24C of the contact parts 24C and 24D disposed in the conductive contact layer 24 is overlapped with the light emitting structure 10 in the vertical direction, and a portion of the second contact part 24D is overlapped with the light emitting structure 10 in the vertical direction. Since the second contact part 24D of the conductive contact layer 24 is disposed along the sidewall of the light emitting structure 10, current may be supplied to a region adjacent to an edge of the active layer 12. Accordingly, the internal quantum efficiency of the active layer 12 can be improved.

Figure 16:
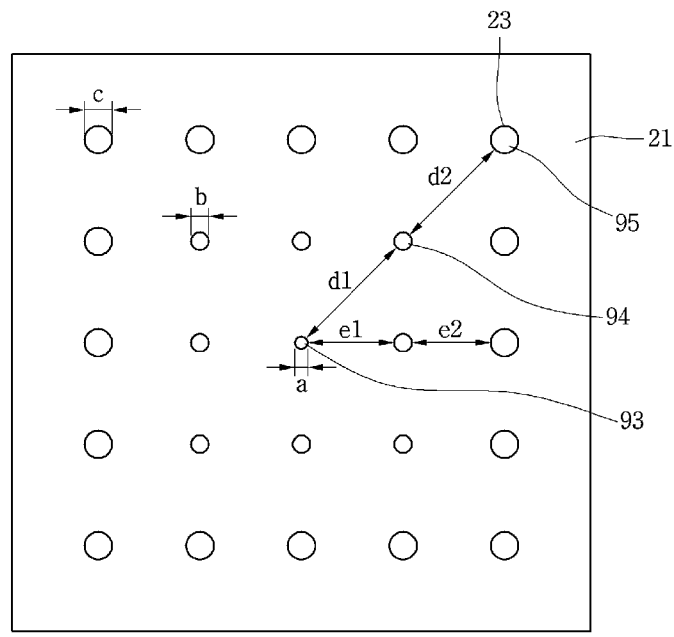
FIG. 16 is a view showing one example a conductive contact layer provided in the region of a mirror layer according to the embodiment.
Figure 17:
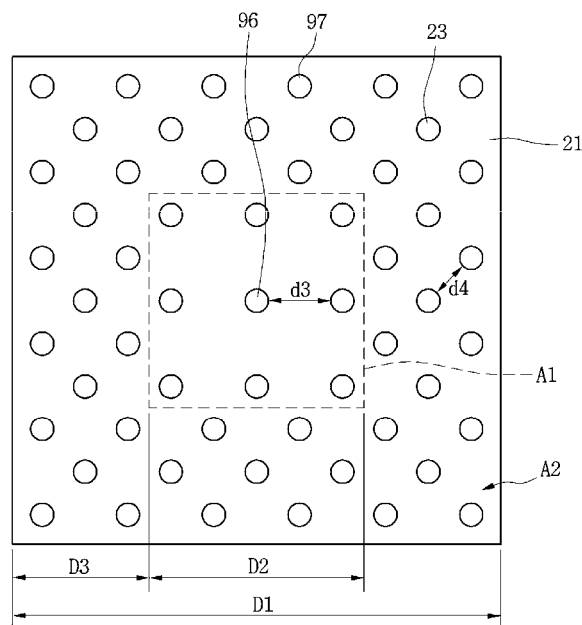
FIG. 17 is a view showing another example of a conductive contact layer provided in the region of the mirror layer according to the embodiment.

FIG. 16 is a plan view showing one example of a conductive contact layer disposed in the mirror layer according to the embodiment. FIG. 17 is a plan view showing another example of the conductive contact layer disposed in the mirror layer.

Referring to FIGS. 1 and 16, the mirror layer 21 may have the DBR structure. The DBR layer has a structure formed by alternately providing first and second dielectric layers having mutually different refractive indexes. Each of the dielectric layers may include an oxide or a nitride including an element selected from the group consisting of Si, Zr, Ta, Ti, and Al. In detail, the dielectric layers may include mutually different layers, which are selected from among $SiO_2$ layer, $Si_3N_4$ layer, $TiO_2$ layer, $Al_2O_3$ layer and an MgO layer, respectively. Each of the dielectric layers may have the thickness of $\lambda/4n$, the $\lambda$ represents a wavelength of light emitted from the active layer and the n represents the refractive indexes of the dielectric layers. The DBR layer has a structure formed by alternately providing two dielectric layers having mutually different refractive indexes. Each dielectric layer may include an oxide or a nitride including an element selected from the group consisting of Si, Zr, Ta, Ti, and Al. In detail, each dielectric layer may include $SiO_2$ layer, $Si_3N_4$ layer, $TiO_2$ layer, $Al_2O_3$ layer.

The conductive contact layer 23 may includes metal, a transmissive metal nitride or a transmissive metal oxide having a refractive index lower than that of the window semiconductor layer 15.

The conductive contact layer 23 may have a thickness h thinner than the thickness T1 of the window semiconductor layer 15. For example, the conductive contact layer 23 may have the thickness which is a range of ⅓ or less of the thickness T1 of the window semiconductor layer 15. The thickness h of the conductive contact layer 23 may be in the range of 10 nm to 100 nm. For example, if the thickness h of the conductive contact layer 23 exceeds the range, the light absorption efficiency may be increased, so that the light transmittance and the light quantity may be degraded. In addition, if the conductive contact layer 23 has an excessively thin thickness, the material of the reflective layer 30 may be diffused, and the electrical characteristic may be degraded.

The contact area between the conductive contact layer 23 and the window semiconductor layer 15 may be increased proportionally to the distance between the conductive contact layer 23 and the electrode pad 70. For example, the contact area may be gradually decreased as the distance between the conductive contact layer 23 and the electrode pad is gradually decreased. On the contrary, as the distance between the conductive contact layer 23 and the electrode pad 70 is gradually increased, the contact area may be gradually increased. In this case, the increase ratio of the contact area may be linearly increased, non-linearly increased, increased step by step, but the embodiment is not limited thereto.

In addition, as the conductive contact layer 23 is gradually closer to a region perpendicular to the electrode pad 70, the contact area between the conductive contact layer 23 and the window semiconductor layer 15 is gradually decreased. As the conductive contact layer 23 is gradually away from the region perpendicular to the electrode pad 70, the contact area between the conductive contact layer 23 and the window semiconductor layer 15 may be increased.

As shown in FIG. 16, the conductive contact layer 23 includes a plurality of contact parts 93, 94, and 95, and at least one of the contact parts 93, 94, and 95 may be disposed in a region that is not overlapped with the first electrode 60 and the electrode pad 70 shown in FIG. 3 in the vertical direction.

The contact parts 93, 94, and 95 may include the first contact part 93 disposed at the center region of the mirror layer 21, the second contact part 94 adjacent to the first contact part 93, and the third contact part 95 disposed at an outer portion of the mirror layer 21. The second contact part 94 may be disposed between the first contact part 93 and the second contact part 95.

The first to third contact parts 93, 94, and 95 may be arranged in such a manner that the sizes of the first to third contact parts 93, 94, and 95 are gradually decreased from an inner portion of the mirror 21 toward the outer portion of the mirror layer 21. In this case, the sizes of the first to third contact parts 93, 94, and 95 may be regions of the top surfaces of the first to third contact parts 93, 94, and 95, that is, the contact regions with the window contact layer 15. In addition, the distances d1 and e1 between the first contact part 93 and the second contact part 94 and the distances d2 and e2 between the second contact part 94 and the third contact part 95 may be gradually decreased outward of the mirror layer 21.

For example, a width a of the top surface of the first contact part 93 is narrower than a width b of the top surface of the second contact part 94, and the width b of the top surface of the second contact part 94 may be narrower than a width c of a top surface of the third contact part 95. The distances d2 and e2 between the second and third contact parts 94 and 95 may be wider than the distances d1 and e1 between the first and second contact parts 93 and 94. Therefore, the sizes of the first to third contact parts 93, 94, and 95 disposed in the conductive contact layer 23 are gradually increased outward of the electrode pad 70, and the distances among the first to third contact parts 93, 94, and 95 are gradually narrowed outward of the electrode pad 70. Accordingly, the supplied current can be uniformly distributed at the outside of the window contact layer 15. Therefore, light can be uniformly generated throughout the entire portion of the active layer 12.

Proportionally to the distance between the electrode pad 70 and the conductive contact layer 23, the sizes of the first to third contact parts 93, 94, and 95 may be gradually increased, and the distances among the first to third contact parts 93, 94, and 95 may be gradually narrowed.

As shown in FIG. 17, the conductive contact layer 23 disposed on the mirror layer 21 may include contact parts 96 and 97 disposed at densities varying depending on regions. For example, the contact parts 96 and 97 may be disposed at different densities in a first region A1 that are overlapped with the electrode pad 70 of FIG. 3 in the vertical direction and a second region A2 disposed at an outer portion of the first region A1. For example, the density of the first contact parts 96 disposed in the first region A1 may be less than the density of the second contact parts 97 disposed in the second region A2. Accordingly, the current supplied from the reflective layer 30 can be uniformly spread by the first and second contact parts 96 and 97 of the conductive contact layer 23. Accordingly, the current flowing down in the vertical direction to the electrode pad 70 can be spread so that the current can flow outward. In this case, the first region A1 may be disposed with a length D2 raging from 40% to 60% of a length D1 of one side of the mirror layer 21. A length D3 between the first region A1 and the edge of the mirror layer 21 may be shorter than the length D2. For example, the length D3 may be in the range of 20% to 30% of the length D1.

A distance d4 between the second contact parts 97 may be shorter than a distance d3 between the first contact parts 96, so that the whole current distribution can be uniformly disposed. The distribution density of the contact parts 96 and 97 may be increased proportionally to the distance between the electrode pad 70 shown in FIG. 1 and the conductive contact layer 23.

According to the embodiment, the distance between contact parts of the conductive contact layer 23 contacted with the bottom surface the window semiconductor layer 15 highly doped, the sizes of the contact parts, or the distribution density of the contact parts are variously adjusted, thereby providing a wider contact area with the outer portion of the window semiconductor layer 15. Accordingly, light can be generated throughout the whole area of the active layer 12.

The reflective layer 30 is disposed under the conductive contact layer 23. The reflective layer 30 makes contact with the bottom surface of the conductive contact layer 23. The reflective layer 30 includes metal, such as Ag, Au, or Al, having 80% or more of reflectance.

The reflective layer 30 and the conductive contact layer 23 may be laminated on each other in the ODR layer structure. The ODR layer structure may include the reflective layer 30 including a metallic layer and the conductive contact layer 23 serving as a low-refractive index layer formed on the reflective layer 30. The metallic reflective layer may include Ag, Au, or Al. The low-refractive index layer may include the transmissive metallic oxide or the transmissive metallic nitride disclosed above. An omni-directional reflection angle on the interfacial surface between the conductive contact layer 23 and the reflective layer 30 can be improved. In addition, the DBR structure and the ODR structure are disposed, so that a reflective characteristic can be improved with respect to a transverse electric (TE)-transverse magnetic (TM) polarization to improve the light extraction efficiency. Therefore, the light emitting device having 100% of the light reflectance can be disposed in the red wavelength range.

Figure 18:
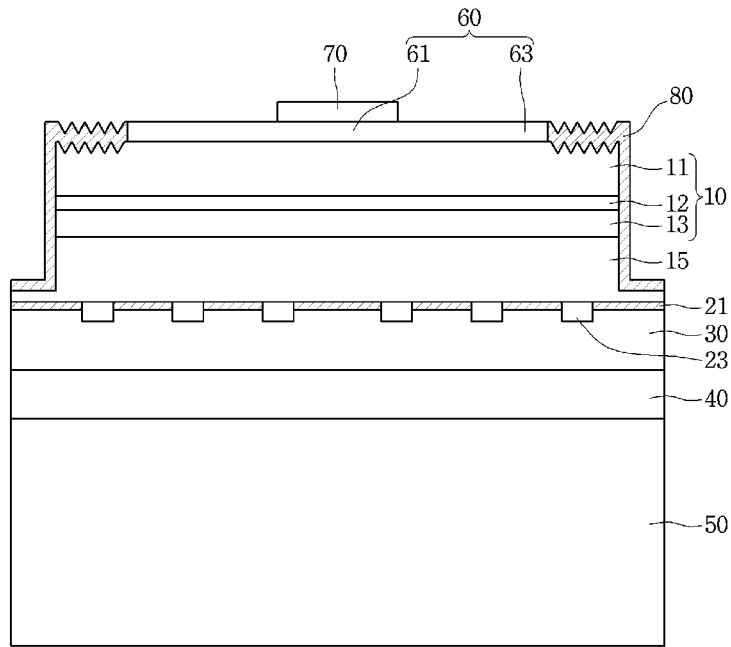
FIG. 18 is a view showing a light emitting device according to the fourth embodiment.
Figure 19:
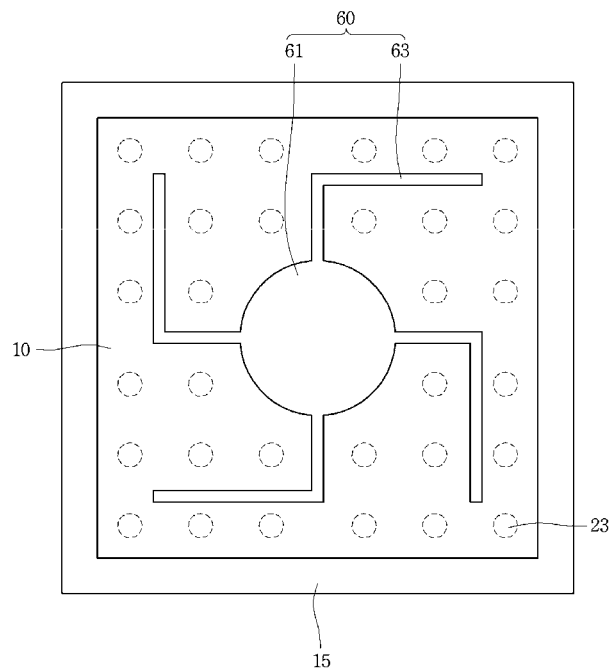
FIG. 19 is a plan view showing the arrangement example of the first electrode and the ohmic contact region applied to the light emitting device of FIG. 18.

FIG. 18 is a view showing the light emitting device according to the fourth embodiment, and FIG. 19 is a plan view showing the arrangement example of the first electrode and the ohmic contact region applied to the light emitting device according to the fourth embodiment. In the following description of the fourth embodiment, the same configuration as that of the above disclosed embodiment will be described by making reference to the description of the above disclosed configuration.

As shown in FIG. 18, the light emitting device may include light emitting structure 10, the window semiconductor layer 15, the conductive contact layer 23, and the first electrode 60.

The light emitting structure 10 may include the first conductive semiconductor layer 11, the active layer 12, and the second conductive semiconductor layer 13. The active layer 12 may be disposed between the first conductive semiconductor layer 11 and the second conductive semiconductor layer 13. The active layer 12 may be disposed under the first conductive semiconductor layer 11, and the second conductive semiconductor layer 13 may be disposed under the active layer 12. For example, the light emitting structure 10 may be realized by including at least two elements selected from the group consisting of aluminum (Al), gallium (Ga), indium (In), and phosphorus (P).

The first conductive semiconductor layer 11 may be realized using a semiconductor material having a compositional formula of $(Al_xGa_{1-x})_yIn_{1-y}P$ (0≤x≤1, and 0≤y≤1). The first conductive semiconductor layer 11 may have y of 0.5 and x in the range of 0.5 to 0.8 in the compositional formula. For example, the first conductive semiconductor layer 11 may include AlGaInP, AlInP, GaP, and GaInP and may be doped with n-type dopants such as Si, Ge, Sn, Se, and Te. For example, the active layer 12 may be realized using a semiconductor material having a compositional formula of $(Al_xGa_{1-x})_yIn_{1-y}P$ (0≤x≤1, 0≤y≤1). For example, the active layer 12 may include AlGaInP, AlInP, GaP, or GaInP. The second conductive semiconductor layer 13 may be realized using a semiconductor material having a compositional formula of $(Al_xGa_{1-x}O_yIn_{1-y}P$ (0≤x≤1, 0≤y≤1). The second conductive semiconductor layer 13 may include AlGaInP, AlInP, GaP, or GaInP, and may be doped with a p-type dopant such as Mg, Zn, Ca, Sr, Ba, or C.

The window semiconductor layer 15 may be disposed. The window semiconductor layer 15 may be realized using a semiconductor material having a compositional formula of $(Al_xGa_{1-x})_yIn_{1-y}P$ (0≤x≤1, 0≤y≤1). The window semiconductor layer 15 may include AlGaInP, AlInP, GaP, or GaInP.

The light emitting device may include the mirror layer 21, the conductive contact layer 23, and the reflective layer 30. The mirror layer 21 may include the ODR layer to reflect light, which is incident from an upper direction, toward the upper direction. The mirror layer 21 may be realized with the refractive index lower than that of the light emitting structure 10. The mirror layer 21 may make contact with the window semiconductor layer 15. The mirror layer 21 may include an oxide or a nitride.

The conductive contact layer 23 may be disposed under the window semiconductor layer 15. The conductive contact layer 23 may make ohmic-contact with the window semiconductor layer 15. The conductive contact layer 23 may include regions making ohmic-contact with the window semiconductor layer 15, that is, a plurality of ohmic contact regions. For example, the ohmic contact regions may be disposed in the form of plural dots.

The light emitting device may include the bonding layer 40 and the support substrate 50. The bonding layer 40 may bond the reflective layer 30 to the support substrate 50. The light emitting device may include the first electrode 60, the electrode pad 70, and the protective layer 80 disposed on the light emitting structure 10.

The light emitting device may further include a highly-doped impurity semiconductor layer disposed between the first electrode 60 and the first conductive semiconductor layer 11. For example, the highly-doped impurity semiconductor layer may be realized using a GaAs layer. The highly-doped impurity semiconductor layer may include impurities having the same polarity as that of the first conductive semiconductor layer 11. The highly-doped impurity semiconductor layer may include impurities having concentration higher than that of the first conductive semiconductor layer 11.

The protective layer 80 may be disposed at an upper portion, a peripheral portion, and a lateral side of the light emitting structure 10. The protective layer 80 may be disposed at a peripheral portion of the window semiconductor layer 15. A portion of the protective layer 80 may be disposed on a portion of the window semiconductor layer 15.

FIG. 19 is a plan view showing the arrangement example of the first electrode 60 and the ohmic contact region applied to the light emitting device.

Referring to FIGS. 18 and 19, the first electrode 60 may include a main electrode 61 and a peripheral electrode 63. For example, the main electrode 61 may be disposed at the center region of the top surface of the light emitting structure 10, and the peripheral electrode 63 may branch from the main electrode 61 while extending outward. For example, the width of the peripheral electrode 63 may be disposed in the range of 4 μm to 5 μm. The main electrode 61 may include a circular top surface or a polygonal top surface. The peripheral electrode 63 may have arm patterns branching in mutually different directions. The first electrode 60 may be electrically connected with the first conductive semiconductor layer 11.

The electrode pad 70 may be disposed corresponding to the main electrode 61. The electrode pad 70 may have a circular top surface or a polygonal top surface. For example, the area of the electrode pad 70 may be equal to narrower than that of the main electrode 61.

The electrode pad 70 may be electrically connected with the main electrode 60. The electrode pad 70 may be disposed on the main electrode 61. The electrode pad 70 may make contact with the main electrode 61.

The first conductive semiconductor layer 11 may include a light extraction structure disposed at a top surface thereof. The light extraction structure may be called an unevenness structure. The light extraction structure may be called a roughness. The protective layer 80 may include a light extraction structure corresponding to that of the first conductive semiconductor layer 11.

According to the embodiment, the main electrode 61 and the peripheral electrode 63 may be variously arranged. In addition, the electrode pad 70 may be variously arranged corresponding to the arrangement of the main electrode 61 and the peripheral electrode 63.

Figure 20:
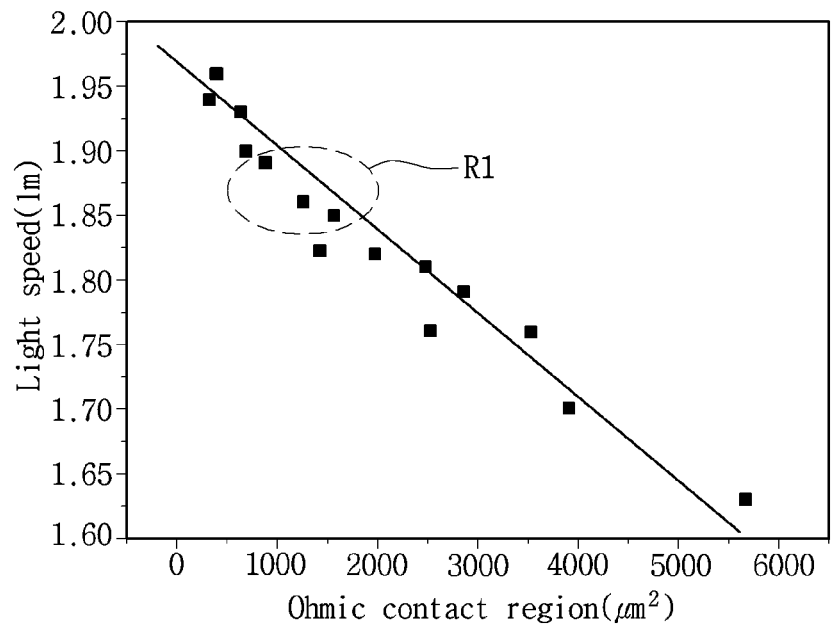
FIG. 20 is a graph showing the variation of a light speed as a function of the variation of an ohmic contact region in the light emitting device of FIG. 18.
Figure 21:
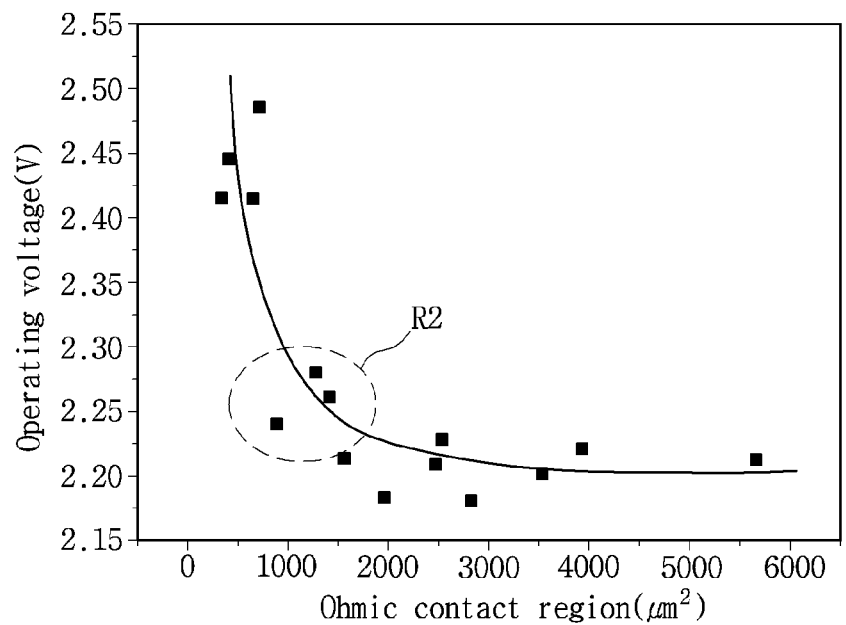
FIG. 21 is a graph showing a graph showing the variation of the operating voltage as a function of the variation of the ohmic contact region in the light emitting device of FIG. 18.

FIG. 20 is a graph showing the variation of a light speed as a function of the ohmic contact region in the light emitting device according to the fourth embodiment. FIG. 21 is a graph showing the variation of operating voltage as a function of the ohmic contact region in the light emitting device according to the fourth embodiment.

As shown in FIG. 20, the light speed varies depending on the variation in the area of the ohmic contact region between the conductive contact layer 23 and the window semiconductor layer 15. In addition, the light speed is linearly reduced as the area of the ohmic contact region of the conductive contact layer 23 is increased.

As shown in FIG. 21, the optical voltage varies depending on the variation in the area of the ohmic contact region. In other words, as the area of the ohmic contact region of the conductive contact layer 23 is increased, the operating voltage is approximately constant after a critical area value.

As shown in FIGS. 20 and 21, the optimal area value of the ohmic contact region can be deduced due to the characteristic of the variation in the operation voltage and the light speed depending on the area of the optical contact region. For example, the whole area of the ohmic contact region of the conductive contact layer 23 may be in the range of 500 μm² to 1500 μm². In this case, the operating voltage of the light emitting device may be in the range of 2.23V to 2.30V as shown in a region R1 of FIG. 20, and the light speed may be in the range of 1.85 lumen to 1.90 lumen as shown in a region R2 of FIG. 21.

For example, the whole area of the window semiconductor layer 15 is 300 μm×350 μm in length and breadth. According to the light emitting device of the embodiment, the whole area of the ohmic contact region of the conductive contact layer 23 may be selected in the range of 0.5% to 1.5% of the whole area of the window semiconductor layer 15.

The conductive contact layer 23 may include a plurality of ohmic contact regions having the dot shape. For example, the width of the dot-shaped region of the conductive contact layer 23 may be selected in the range of 5 μm to 15 μm. In addition, 20 to 40 dot-shaped ohmic contact regions of the conductive contact layer 23 may be disposed.

The first electrode 60 may not be overlapped with the ohmic contact regions in the vertical direction. Accordingly, current applied to the light emitting structure 10 may be spread and flow, and the light emission efficiency can be improved.

In addition, regarding the current spreading, when the areas of the ohmic contact regions of the conductive contact layer 23 are adjusted so that the a large number of the ohmic contact regions has narrower areas as compared with the case that a small number of the ohmic contact regions has wider areas on the assumption that the whole areas of the ohmic contact regions are constant, a greater current spreading effect can be made.

Hereinafter, a method of fabricating a light emitting device according to the embodiment will be described with respect to FIGS. 22 to 25.

Figure 22:
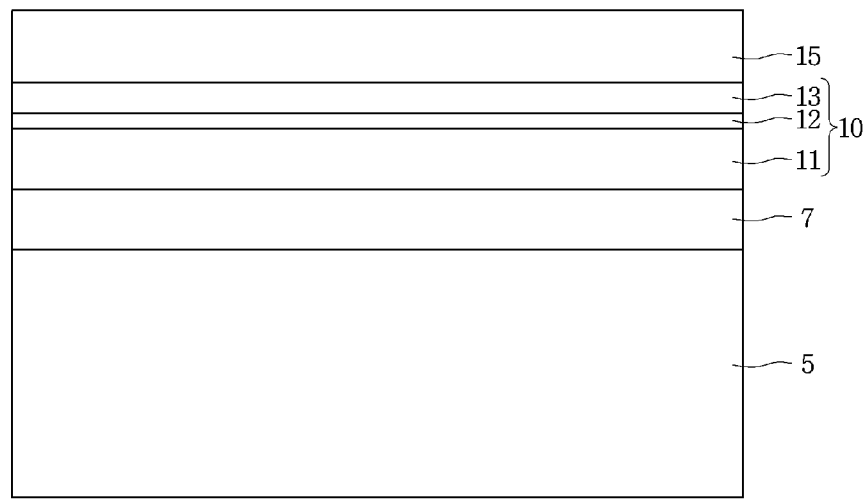
FIGS. 22 to 25 are sectional views showing a method of fabricating the light emitting device of FIG. 18.

According to the method of fabricating the light emitting device of the embodiment, as shown in FIG. 22, an etching stop layer 7, the first conductive semiconductor layer 11, the active layer 12, the second conductive semiconductor layer 13, and the window semiconductor layer 15 may be formed on the substrate 5. The first conductive semiconductor layer 11, the active layer 12, and the second conductive semiconductor layer 13 may constitute the light emitting structure 10.

For example, the substrate 5 may include at least one of sapphire substrate ($Al_2O_3$), SiC, GaAs, GaN, ZnO, Si, GaP, InP, and Ge, but the embodiment is not limited thereto. A buffer layer may be further disposed between the substrate 5 and the etching stop layer 7.

For example, the etching stop layer 7 may be realized using a semiconductor material having a composition of $(Al_xGa_{1-x})_yIn_{1-y}P$ (0≤x≤1, 0≤y≤1). The function of the etching stop layer 7 will be described later. The buffer layer may be further formed between the substrate 5 and the etching stop layer 7.

The semiconductor layer grown on the substrate 5 may be formed through a metal organic chemical vapor deposition (MOCVD) scheme, a chemical vapor deposition (CVD) scheme, a plasma-enhanced chemical vapor deposition (PECVDE), a molecular beam epitaxial (MBE) scheme, and a hydride vapor phase epitaxial (HVPE) scheme, but the embodiment is not limited thereto.

The first conductive semiconductor layer 11 may be realized using a semiconductor material having a compositional formula of $(Al_xGa_{1-x})_yIn_{1-y}P$ (0≤x≤1, and 0≤y≤1). The first conductive semiconductor layer 11 may have y of 0.5 and x in the range of 0.5 to 0.8 in the compositional formula. For example, the first conductive semiconductor layer 11 may include AlGaInP, AlInP, GaP, and GaInP and may be doped with n-type dopants such as Si, Ge, Sn, Se, and Te.

The active layer 12 may be realized using a compound semiconductor. For example, the active layer 12 may be realized using a group II-VI, or group III-V compound semiconductor. The active layer 12 may be realized using a compositional formula of $(Al_xGa_{1-x})_yIn_{1-y}P$ (0≤x≤1, 0≤y≤1). For example, the active layer 12 may include AlGaInP, AlInP, GaP, or GaInP.

The second conductive semiconductor layer 13 may be realized using a semiconductor material having a compositional formula of $(Al_xGa_{1-x})_yIn_{1-y}P$ (0≤x≤1, 0≤y≤1). The second conductive semiconductor layer 13 may include AlGaInP, AlInP, GaP, or GaInP, and may be doped with a p-type dopant such as Mg, Zn, Ca, Sr, Ba, or C.

For example, the light emitting structure 10 may be realized by including at least two elements selected from the group consisting of Al, Ga, In, and P.

The window semiconductor layer 15 may be realized using a semiconductor material having a compositional formula of $(Al_xGa_{1-x})_yIn_{1-y}P$ (0≤x≤1, 0≤y≤1). The window semiconductor layer 15 may include AlGaInP, AlInP, GaP, or GaInP. The window semiconductor layer 15 may provide a current spreading effect when the light emitting device is driven.

Figure 23:
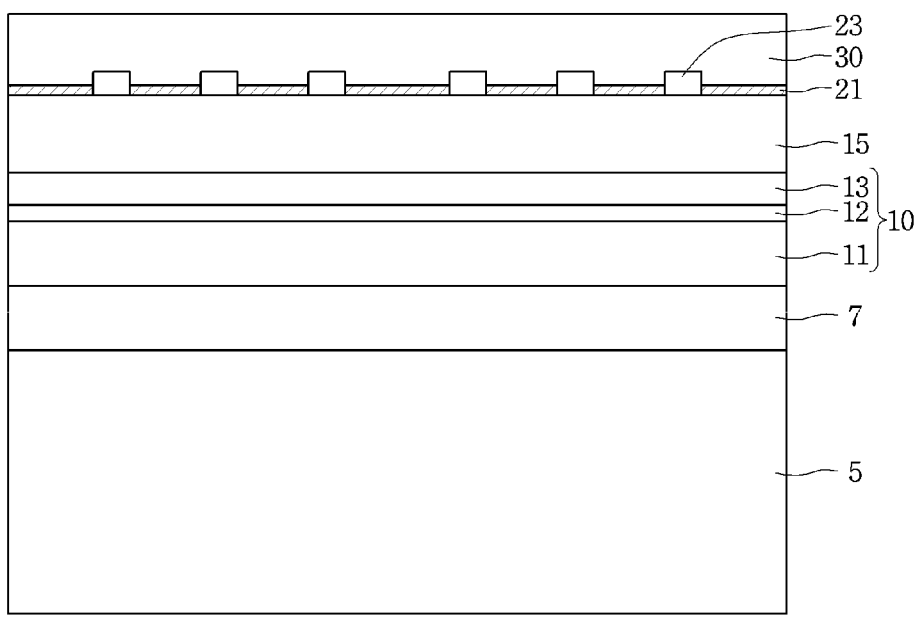

As shown in FIG. 23, the mirror layer 21, the conductive contact layer 23, and the reflective layer 30 may be formed on the window semiconductor layer 15.

The mirror layer 21 may reflect incident light again. The mirror layer 21 may make contact with the window semiconductor layer 15.

The mirror layer 21 may include an oxide or a nitride. For example, the mirror layer 21 may include at least one selected from the group consisting of $SiO_2$, SiNx, ITO, IZO, AZO, ATO, IZTO, IAZO, GZO, IGZO, IGTO, and AZO.

The conductive contact layer 23 may be realized to make ohmic contract with the window semiconductor layer 15. The conductive contact layer 23 may include a region making ohmic contact with the window semiconductor layer 15. The conductive contact layer 23 may be electrically connected with the light emitting structure 10. The conductive contact layer 23 may be formed through the mirror layer 21. For example, the conductive contact layer 23 may be realized to have a circular top surface or an oval top surface. For example, the conductive contact layer 23 may include at least one of selected from the group consisting of Au, Au/AuBe/Au, AuZn, ITO, AuBe, and GeAu.

The reflective layer 30 may be disposed on the conductive contact layer 23. The reflective layer 30 may be disposed on the mirror layer 21. The reflective layer 30 may reflect incident light. The reflective layer 30 may include at least one selected from the group consisting of Ag, Au, and Al.

Figure 24:
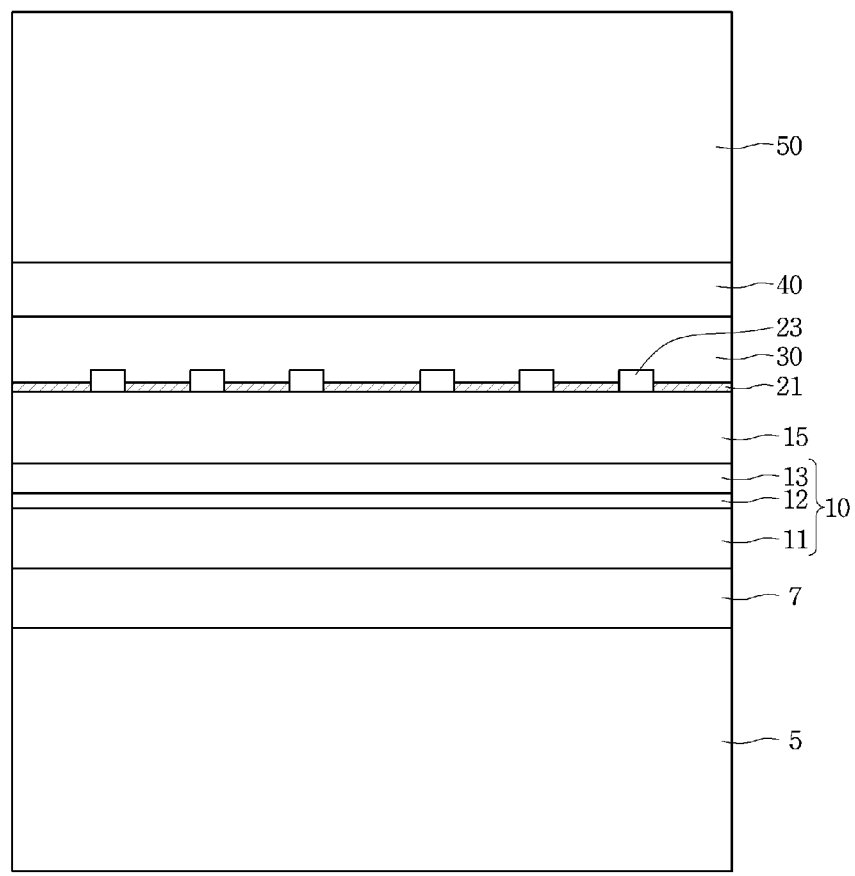

Thereafter, as shown in FIG. 24, the bonding layer 40 and the support substrate 50 may be disposed on the reflective layer 30.

The bonding layer 40 may bond the reflective layer 30 to the support substrate 50.

Next, the substrate 5 is removed from the etching stop layer 7. For example, the substrate 5 may be removed through an etching process. When the substrate 5 is realized using GaAs, the substrate 5 may be removed through a wet etching process, and the etching stop layer 7 is not etched, so that only the substrate 5 is etched and separated. Accordingly, the etching stop layer 7 may serve as a stop layer. The etching stop layer 7 may be separated from the light emitting structure 10 through an additional removal process. For example, the etching stop layer 7 may be removed through an additional etching process. The etching stop layer 7 may be realized using a semiconductor material having a compositional formula of $(Al_xGa_{1-x})_yIn_{1-y}P$ (0≤x≤1, 0≤y≤1).

Figure 25:
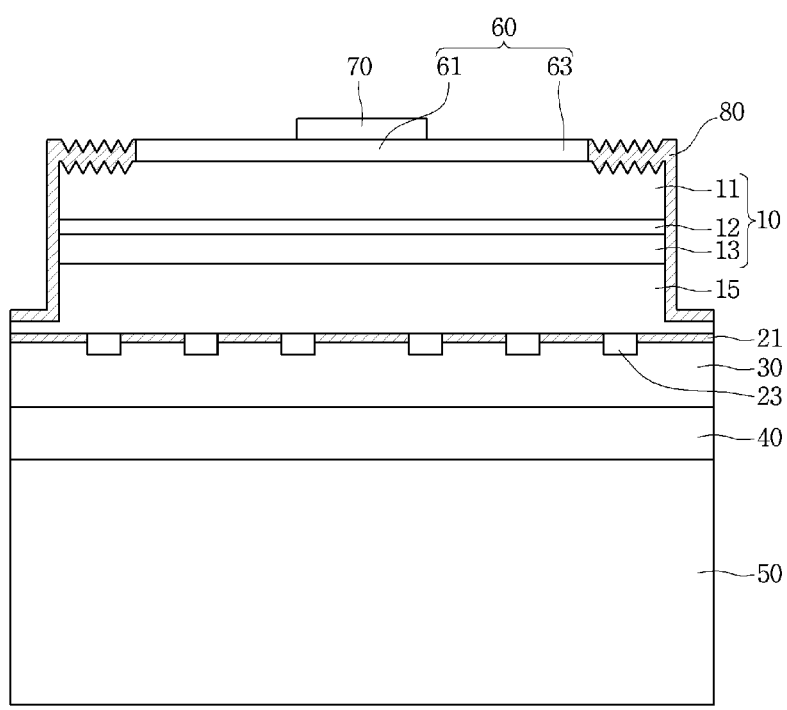

Thereafter, as shown in FIG. 25, the first electrode 60 may be formed on the light emitting structure 10, and the light extraction structure may be formed on the first conductive semiconductor layer 11. Next, an isolation etching process is performed, so that the lateral side of the light emitting structure 10 may be etched. In addition, the protective layer 80 and the electrode pad 70 may be formed on the light emitting structure 10.

The first electrode 60 according to the embodiment may be disposed on the light emitting structure 10. The first electrode 60 may include the main electrode 61 and the peripheral electrode 63. The main electrode 61 may be disposed at the center region of the top surface of the light emitting structure 10, and the peripheral electrode 63 may branch from the main electrode 61 while extending outward. For example, the width of the peripheral electrode 63 may be disposed in the range of 4 μm to 5 μm. The main electrode 61 may include a circular top surface or a polygonal top surface. The electrode pad 70 may be disposed corresponding to the main electrode 61. The electrode pad 70 may have a circular top surface or a polygonal top surface.

The protective layer 80 may be disposed on the light emitting structure 10. The protective layer 80 may be disposed on the first conductive semiconductor layer 11. The first conductive semiconductor layer 11 may include a light extraction structure R disposed on a top surface thereof. The light extraction structure R may be called an unevenness structure or a roughness. The protective layer 80 may have a light extraction structure corresponding to the light extraction structure disposed in the first conductive semiconductor layer 11.

According to the embodiment, the main electrode 61 and the peripheral electrode 63 may be variously arranged. In addition, the electrode pad 70 may be variously arranged corresponding to the arrangement of the main electrode 61 and the peripheral electrode 63.

According to the embodiment, as shown in FIG. 20, the light speed varies depending on the variation in the area of the ohmic contact region between the conductive contact layer 23 and the window semiconductor layer 15. In addition, the light speed is linearly reduced as the area of the ohmic contact region of the conductive contact layer 23 is increased.

As shown in FIG. 21, the optical voltage varies depending on the variation in the area of the ohmic contact region. In other words, as the area in the ohmic contact region of the conductive contact layer 23 is increased, the operating voltage becomes approximately constant after a critical area value.

As shown in FIGS. 20 and 21, the optimal area value of the ohmic contact region can be deduced due to the characteristic of the variation in the operation voltage and the light speed depending on the area of the optical contact region. For example, the whole area of the ohmic contact region of the conductive contact layer 23 may be in the range of 500 μm² to 1500 μm². In this case, the operating voltage of the light emitting device may be in the range of 2.23V to 2.30V as shown in a region R1 of FIG. 20, and the light speed may be in the range of 1.85 lumen to 1.90 lumen as shown in a region R2 of FIG. 21.

For example, the whole area of the window semiconductor layer 15 is 300 μm×350 μm in length and breadth. According to the light emitting device of the embodiment, the whole area of the ohmic contact region of the conductive contact layer 23 may be selected in the range of 0.5% to 1.5% of the whole area of the window semiconductor layer 15.

According to the embodiment, the first electrode 60 may not be overlapped with the ohmic contact regions in the vertical direction. Accordingly, current applied to the light emitting structure 10 may be spread and flow, and the light emission efficiency can be improved.

In addition, regarding the current spreading, when the area of the ohmic contact regions of the conductive contact layer 23 is adjusted so that the a large number of the ohmic contact regions have narrower areas as compared with the case that a small number of the ohmic contact regions have wider areas on the assumption that the whole area of the ohmic contact regions is constant, a greater current spreading effect can be made.

Figure 26:
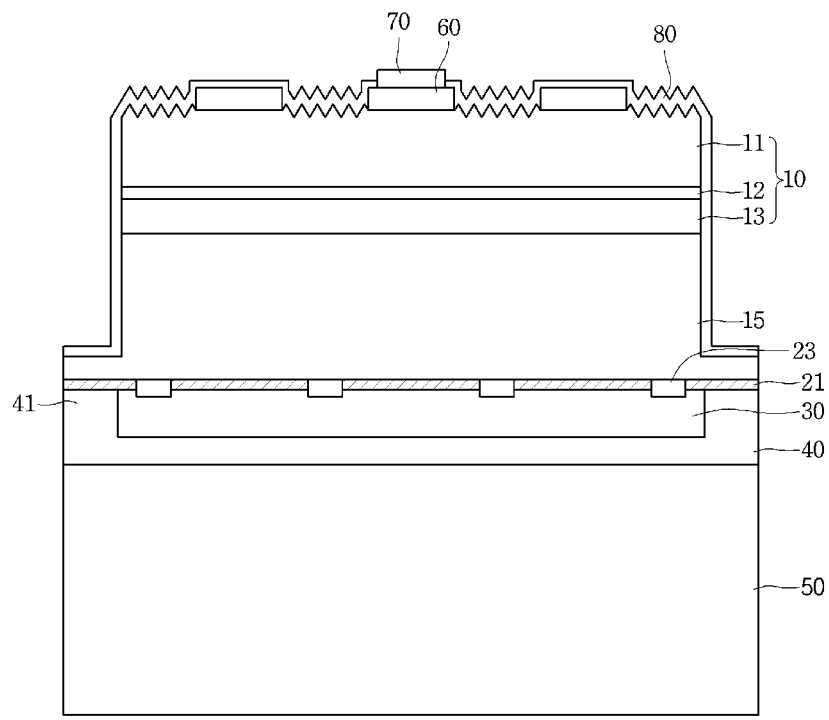
FIG. 26 is a sectional view showing a light emitting device according to the fifth embodiment.

FIG. 26 is a sectional view showing a light emitting device according to the fifth embodiment. In the following description of the fifth embodiment, the same configuration as those of the above embodiments will be described by making reference to the description of those of the above embodiments.

As shown in FIG. 26, the light emitting device may include the light emitting structure 10, the window semiconductor layer 15, the mirror layer 21, the conductive contact layer 23, the reflective layer 30, the bonding layer 40, the support substrate 50, and the protective layer 80.

The light emitting structure 10 may include the first conductive semiconductor layer 11, the active layer 12, and the second conductive semiconductor layer 13 disclosed above. The active layer 12 may include a plurality of barrier layers and a plurality of well layers. The active layer 12 may include a barrier layer having a region that is not doped with impurities and a region that is doped with impurities. n-type impurities may be doped into the barrier layer of the active layer 12. For example, the barrier layer and the well layer of the active layer 12 may include an AlGaInP composition, and the Al composition included in the barrier layer may be greater than the Al composition included in the well layer.

The window semiconductor layer 15 will be understood by those skilled in the art by employing the description of that of the embodiment.

The light emitting device according to the embodiment may include the mirror layer 21, the conductive contact layer 23, and the reflective layer 30. The mirror layer 21 may include an ODR layer and may be disposed under the window semiconductor layer 15. The materials of the mirror layer 21 and the conductive contact layer 23 will be understood by those skilled in the art by employing the above description.

The conductive contact layer 23 may be formed through the mirror layer 21. The mirror layer 21 may include a through hole. The conductive contact layer 23 is disposed in a through hole to make ohmic contact with the window semiconductor layer 15.

The description of the reflective layer 30 will be understood by those skilled in the art by employing the above disclosed description. The width of the reflective layer 30 may be equal to or wider than that of the light emitting structure 10. In addition, the width of the reflective layer 30 may be narrower than that of the window semiconductor layer 15.

The light emitting device according to the embodiment may include the bonding layer 40 and the support substrate 50. The materials of the bonding layer 40 and the support substrate 50 will be understood by those skilled in the art by employing the above disclosed description.

The bonding layer 40 may be disposed under the reflective layer 30. An outer upper portion 41 of the bonding layer 40 may be disposed at a peripheral portion of the reflective layer 30. An outer top surface of the bonding layer 40 may make contact with the mirror layer 21. The uppermost surface of the bonding layer 40 may make contact with a bottom surface of the mirror layer 21. The outer upper portion of the bonding layer 40 may be disposed in a shape of surrounding the lateral side of the reflective layer 30.

According to the embodiment, the bonding layer 40 may prevent the reflective layer 30 from being exposed to the outside. The bonding layer 40 may prevent the lateral side or the bottom surface of the reflective layer 30 from being exposed to the outside. Accordingly, the material constituting the reflective layer 30 can be prevented from being moved to the lateral side or the upper portion of the light emitting structure 10 as the light emitting device is driven.

When the material constituting the reflective layer 30 is moved to the region of the light emitting structure 10, the moved material absorbs light supplied from the light emitting structure 10, so that the light speed may be degraded. According to the embodiment, the reflective layer 30 can be prevented from being exposed to the outside to prevent the material constituting the reflective layer 30 from being moved as the light emitting device is driven. Accordingly, the light speed of the light emitting device can be prevented from being degraded, and the reliability of the light emitting device can be ensured.

For example, the width of the bonding layer 40 may be wider than the width of the reflective layer 30. The width of the bonding layer 40 may be wider than the width of the light emitting structure 10. The width of the bonding layer 40 may be equal to that of the mirror layer 20.

The light emitting device according to the embodiment may include the first electrode 60 and the electrode pad 70 disposed on the light emitting structure 10. The first electrode 60 and the electrode pad 70 can be understood by those skilled in the art by making reference to the above description.

Hereinafter, a method of fabricating the light emitting device of FIG. 26 will be described with reference to FIGS. 27 to 30. In the following description of the method of fabricating the light emitting device, the same configuration as those of the above disclosed embodiments will be described by making reference to the description of those of the above disclosed embodiments.

Figure 27:
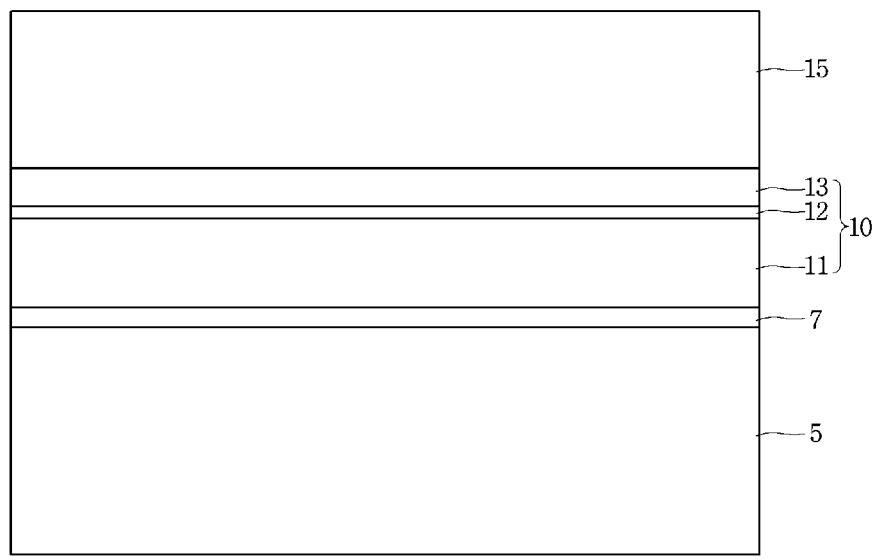
FIGS. 27 to 30 are sectional views showing a method of fabricating the light emitting device of FIG. 26.

As shown in FIG. 27, the etching stop layer 7, the first conductive semiconductor layer 11, the active layer 12, the second conductive semiconductor layer 13, and the window semiconductor layer 15 may be formed on the substrate 5.

Figure 28:
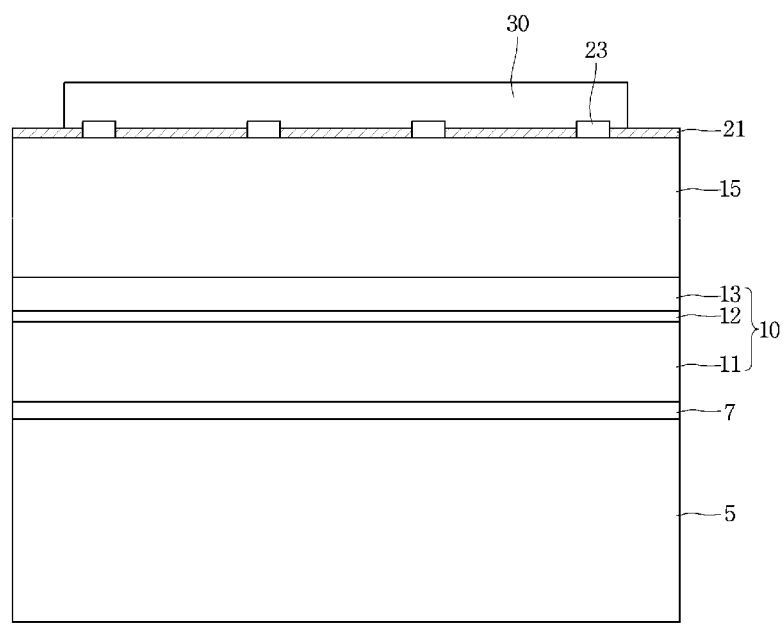

As shown in FIG. 28, the window semiconductor layer 15 may be disposed thereon with the mirror layer 21, the conductive contact layer 23, and the reflective layer 30. The reflective layer 30 may be disposed on the conductive contact layer 23. The reflective layer 30 may be disposed on the mirror layer 21. The reflective layer 30 may reflect the incident light again. For example, the reflective layer 30 may include at least one selected from the group consisting of Ag, Au, and Al. The width of the reflective layer 30 may be narrower than that of the mirror layer 21.

Figure 29:
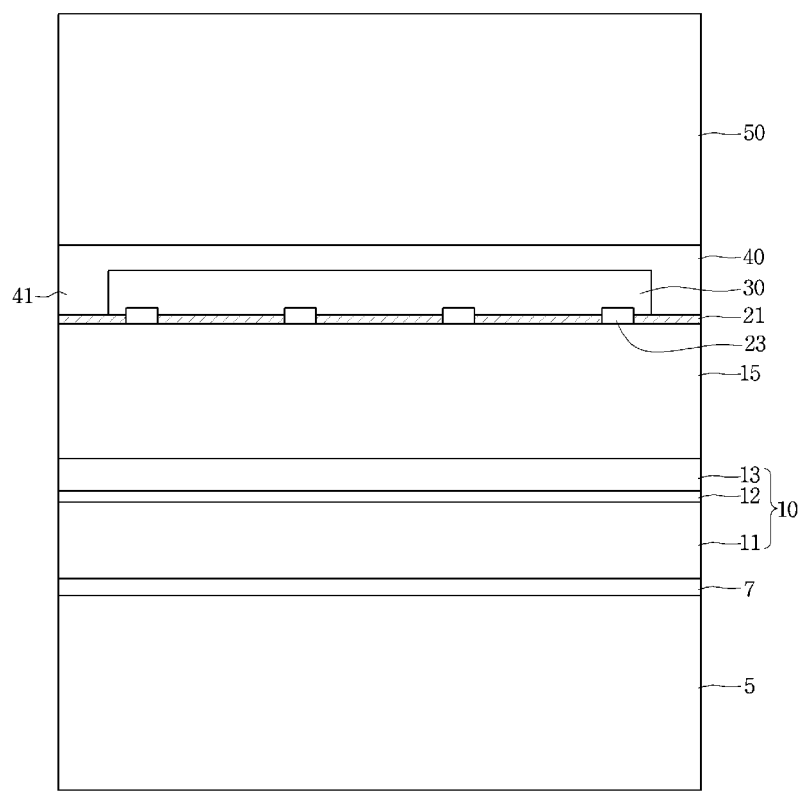

Thereafter, as shown in FIG. 29, the bonding layer 40 and the support substrate 50 may be disposed on reflective layer 30.

Figure 30:
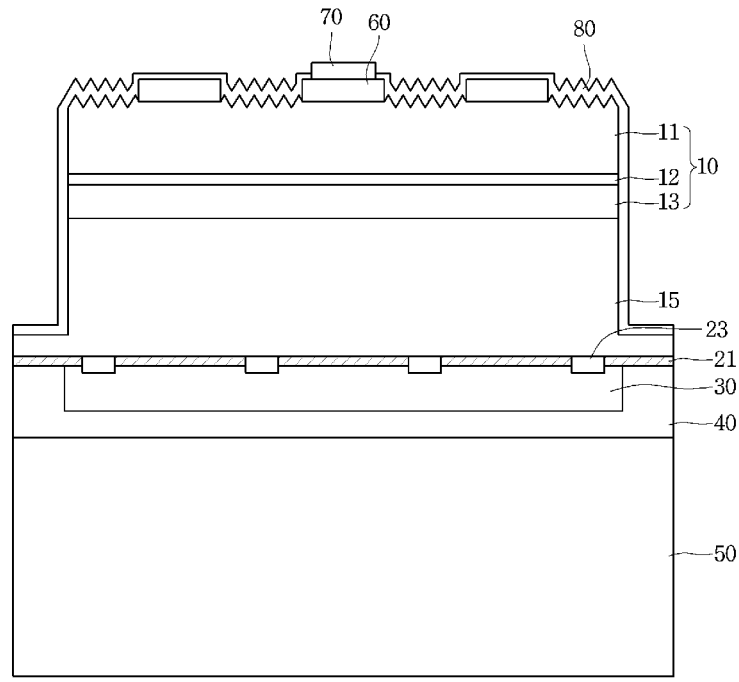

Next, the substrate 5 is removed from the etching stop layer 7. Thereafter, as shown in FIG. 30, the first electrode 60 is formed on the light emitting structure 10, and an isolation etching process is performed with respect to the resultant structure, so that the lateral side of the light emitting structure 10 may be etched. The protective layer 80 and the electrode pad 70 may be formed on the light emitting structure 10 and the first electrode 60. The protective layer 80 may be disposed on the upper portion, the peripheral portion, and the lateral side of the light emitting structure 10.

The protective layer 80 may be disposed at the peripheral portion of the window semiconductor layer 15. A portion of the protective layer 80 may be disposed on a portion of the window semiconductor layer 15. The method of fabricating the light emitting device described above may be modified according to occasions or process designs.

According to the embodiment, the bonding layer 40 may be disposed under the reflective layer 30. The outer upper portion 41 of the bonding layer 40 may be disposed at a peripheral portion of the reflective layer 30. The outer upper portion 41 of the bonding layer 40 may make contact with the mirror layer 21. The outer uppermost surface of the bonding layer 40 may make contact with a bottom surface of the mirror layer 21. The outer upper portion of the bonding layer 40 may be disposed in a shape of surrounding the lateral side of the reflective layer 30. The width of the bonding layer 40 may be wider than that of the reflective layer 30. The width of the bonding layer 40 may be wider than the width of the light emitting structure 10. The width of the bonding layer 40 may be equal to the width of the mirror layer 21.

According to the embodiment, the bonding layer 40 may prevent the reflective layer 30 from being exposed to the outside. For example, the bonding layer 40 may prevent the lateral side or the bottom surface of the reflective layer 30 from being exposed to the outside. Accordingly, the material constituting the reflective layer 30 can be prevented from being moved to the lateral side or the upper portion of the light emitting structure 10 as the light emitting device is driven. When the material constituting the reflective layer 30 is moved to the region of the light emitting structure 10, the moved material absorbs light supplied from the light emitting structure 10, so that the light speed may be degraded. According to the embodiment, the reflective layer 30 can be prevented from being exposed to the outside to prevent the material constituting the reflective layer 30 from being moved as the light emitting device is driven. Accordingly, the light speed of the light emitting device can be prevented from being degraded, and the reliability of the light emitting device can be ensured.

Figure 31:
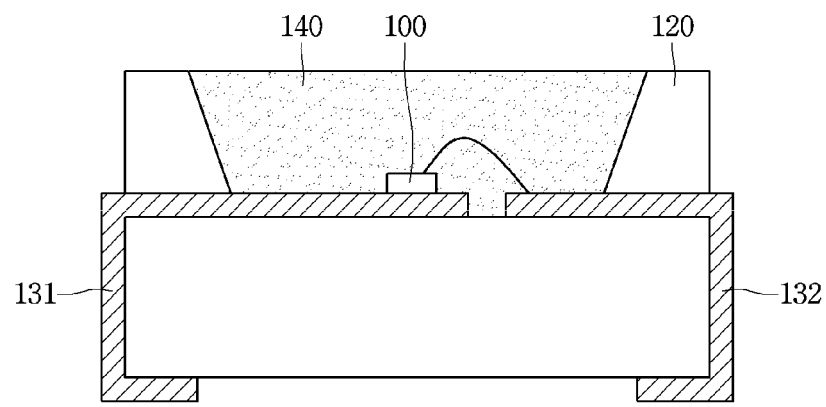
FIG. 31 is a sectional view showing a light emitting device package according to the embodiment.

FIG. 31 is a sectional view showing a light emitting device package employing the light emitting device according to the embodiment.

Referring to FIG. 31, the light emitting device package according to the embodiment may include a body 120, first and second lead electrodes 131 and 132 on the body 120, the light emitting device 100 according to the embodiment disposed in the body 120 and electrically connected with the first and second lead electrodes 131 and 1321, and a molding member 140 to surround the light emitting device 100.

The body 120 may include a silicon material, a synthetic resin material, or a metallic material, and an inclined surface may be formed around the light emitting device 100.

The first and second lead electrodes 131 and 132 are electrically isolated from each other to supply power to the light emitting device 100. In addition, the first and second lead electrodes 131 and 132 may reflect the light emitted from the light emitting device to increase the light efficiency, and may discharge heat emitted from the light emitting device to the outside.

The light emitting device may be disposed on the body 120 or may be disposed on the first lead electrode 131 or the second lead electrode 132.

The light emitting device 100 may be electrically connected with the first lead electrode 131 and the second lead electrode 132 through one of a wire scheme, a flip-chip scheme, or a die bonding scheme.

The molding member 140 may protect the light emitting device 100 by surrounding the light emitting device 100. In addition, the molding member 140 includes a phosphor to change the wavelength of the light emitted from the light emitting device 100.

A plurality of light emitting devices and light emitting device packages according to the embodiment may be arrayed on a substrate, and a lens, a light guide plate, a prism sheet, and a diffusion sheet may be disposed on a light path of the light emitting device package. The light emitting device package, the substrate, and the optical member may perform a function of a light unit. The light unit may be realized as a top-view light unit or a side-view light unit and disposed in a display device of a portable terminal or a laptop computer, or variably applied to a lighting device or an indicator. According to another embodiment, a lighting device including the light emitting device or the light emitting device package according to the embodiments can be realized. For example, the lighting device may include a lamp, a street lamp, an electronic display, and a headlamp.

The light emitting device is applicable to a light unit. The light unit includes a structure in which a plurality of light emitting devices are arrayed. The lighting system includes a display apparatus shown in FIGS. 32 and 33, a lighting apparatus shown in FIG. 34, a lighting lamp, a camera flash, a signal lamp, a headlamp for a vehicle, and an electronic display.

Figure 32:
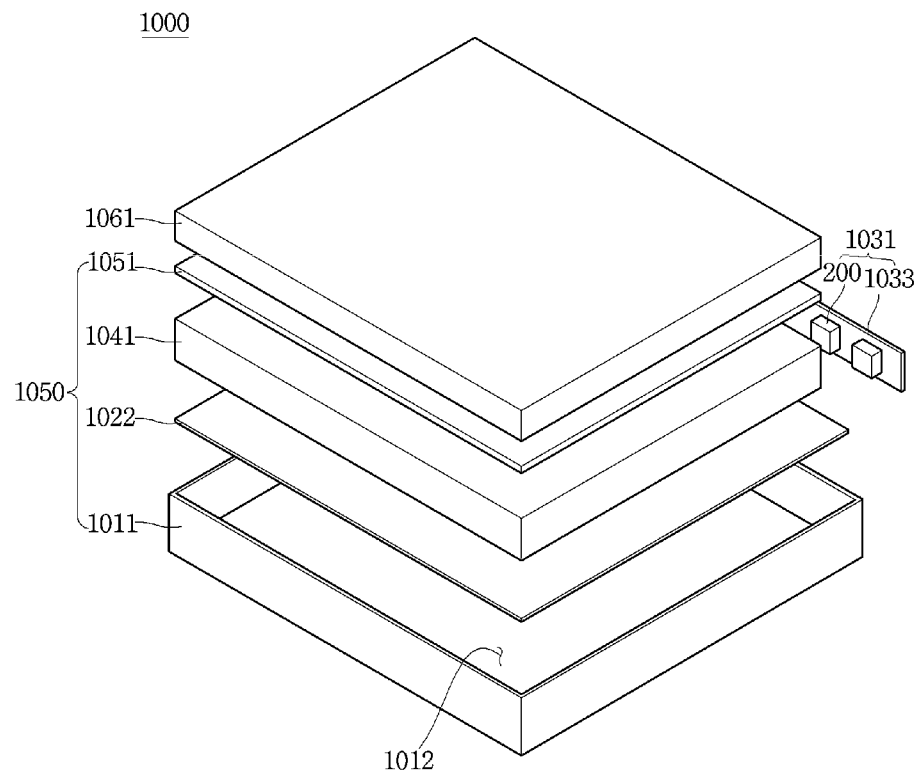
FIG. 32 is a view showing a display device according to the embodiment.

FIG. 32 is an exploded perspective view showing a display apparatus having the light emitting device according to the embodiment.

Referring to FIG. 32, a display apparatus 1000 according to the embodiment includes a light guide plate 1041, a light emitting module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041, the optical sheet 1051, and the light unit 1050 may be defined as a backlight unit.

The light guide plate 1041 diffuses the light supplied from the light emitting module 1031 to provide surface light. The light guide plate 1041 may include a transparent material. For example, the light guide plate 1041 may include one of acryl-based resin, such as PMMA (polymethyl methacrylate), PET (polyethylene terephthalate), PC (polycarbonate), COC (cyclic olefin copolymer) and PEN (polyethylene naphtha late) resin.

The light emitting module 1031 is disposed on at least one side of the light guide plate 1041 to supply the light to at least one side of the light guide plate 1041. The light emitting module 1031 serves as the light source of the display device.

At least one light emitting module 1031 is disposed to directly or indirectly supply the light from one side of the light guide plate 1041. The light emitting module 1031 may include a board 1033 and the light emitting device according to the embodiments or the light emitting device package 200. The light emitting device or the light emitting device package 200 are arranged on the board 1033 while being spaced apart from each other at the predetermined interval.

The board 1033 may include a printed circuit board (PCB) including a circuit pattern (not shown). In addition, the board 1031 may also include a metal core PCB (MCPCB) or a flexible PCB (FPCB) as well as a resin-based PCB, but the embodiment is not limited thereto. If the light emitting device package 200 is installed on the side of the bottom cover 1011 or on a heat dissipation plate, the board 1033 may be omitted. The heat dissipation plate partially makes contact with the top surface of the bottom cover 1011.

In addition, the light emitting device package 200 are arranged such that light exit surfaces to discharge light of the light emitting device package 200 are spaced apart from the light guide plate 1041 by a predetermined distance on the board 1033, but the embodiment is not limited thereto. The light emitting device package 200 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer disposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light emitting module 1031 as optical members, but the embodiment is not limited thereto.

Figure 33:
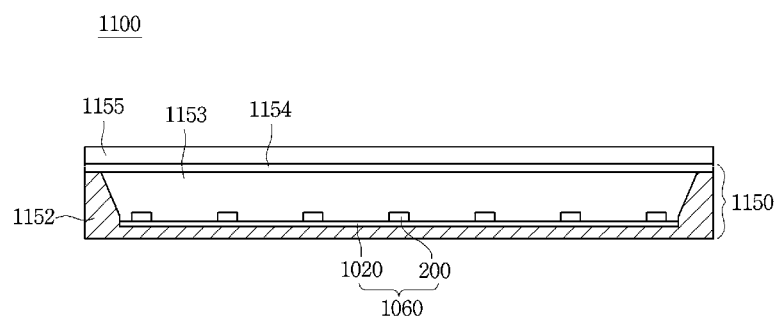
FIG. 33 is a view showing another example of the display device according to the embodiment.

FIG. 33 is a sectional view showing a display apparatus according to the embodiment.

Referring to FIG. 33, the display device 1100 includes a bottom cover 1152, a board 1120 on which the light emitting device package 200 are arrayed, an optical member 1154, and a display panel 1155.

The board 1120 and the light emitting device package 200 may constitute the light emitting module 1060. In addition, the bottom cover 1152, at least one light emitting module 1060, and the optical member 1154 may constitute the light unit 1150. The bottom cover 1151 can be disposed with a receiving section 1153, but the embodiment is not limited thereto. The light emitting module 1060 includes a board 1120, and a plurality of light emitting devices arranged on the board 1120 or a light emitting device package 200.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light emitting module 1060 in order to convert the light emitted from the light emitting module 1060 into the surface light.

Figure 34:
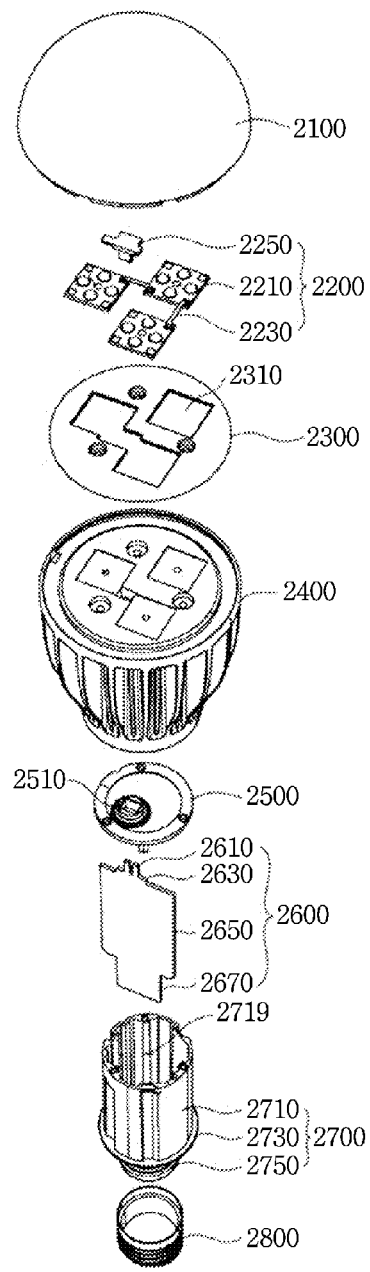
FIG. 34 is a view showing a lighting device according to the embodiment.

FIG. 34 is an exploded perspective view showing a lighting device having the light emitting device according to the embodiment.

Referring to FIG. 34, the lighting device according to the embodiment may include a cover 2100, a light emitting module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 2650. For example, the parts include a DC converter, a driving chip to drive the light source module 2220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

According to the embodiment, the light emitting device having improved electrical characteristics and light extraction efficiency can be disposed.

According to the embodiment, the optical reliability of the light emitting device can be improved.

According to the light emitting device, the light emitting device package, and the light unit of the embodiment, the operating voltage can be lowered and the light speed can be improved. According to the embodiment, the light extraction efficiency of the light emitting device package and the light unit can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure comprising a first conductive semiconductor layer, an active layer under the first conductive semiconductor layer, and a second conductive semiconductor layer under the active layer;
    a first electrode electrically connected with the first conductive semiconductor layer;
    a mirror layer under the light emitting structure;
    a window semiconductor layer between the mirror layer and the light emitting structure;
    a reflective layer under the mirror layer;
    a conductive contact layer disposed between the reflective layer and the window semiconductor layer and contacted with the second conductive semiconductor layer; and
    a support substrate having a conductive property under the reflective layer,
    wherein the window semiconductor layer comprises a phosphorus (P)-based semiconductor doped with carbon (C) and has a dopant concentration higher than a dopant concentration of the second conductive semiconductor layer,
    wherein the conductive contact layer includes a material different from a material of the mirror layer, and has a thickness thinner than a thickness of the window semiconductor layer,
    wherein the window semiconductor layer includes an outer portion,
    wherein the outer portion of the window semiconductor layer is disposed at a lower peripheral portion of the window semiconductor layer and is protruded outward from a sidewall of the light emitting structure,
    wherein the light emitting structure includes at least two elements selected from the group consisting of aluminum (Al), gallium (Ga), indium (In), and a phosphorus (P), and the window semiconductor layer includes a GaP semiconductor,
    wherein the conductive contact layer comprises a plurality of contact parts formed through the mirror layer and spaced apart from each other, and the reflective layer connects the connect parts with each other, and
    wherein the contact parts comprise
    a plurality of first contact parts having an entire portion of a top surface overlapped with the light emitting structure in a vertical direction, respectively; and
    a plurality of second contact parts having a portion of a top surface disposed outward from the sidewall of the light emitting structure.

2. The light emitting device of claim 1, wherein the active layer emits light having a wavelength in a range of 600 nm to 630 nm.

3. The light emitting device of claim 1, wherein the window semiconductor layer has a thickness thicker than a thickness of the second conductive semiconductor layer, and the mirror layer and the conductive contact layer have refractive indexes lower than a refractive index of the window semiconductor layer.

4. The light emitting device of claim 1, wherein the window semiconductor layer comprises a p-type semiconductor layer, and a carbon (C) dopant concentration is in a range of $5E18$ $cm^{-3}$ to $1E20$ $cm^{-3}$.

5. The light emitting device of claim 1, wherein a portion of the conductive contact layer is disposed between the mirror layer and the reflective layer.

6. A light emitting device comprising:
    a light emitting structure comprising a first conductive semiconductor layer, an active layer under the first conductive semiconductor layer, and a second conductive semiconductor layer under the active layer;
    a first electrode electrically connected with the first conductive semiconductor layer;
    a mirror layer under the light emitting structure;
    a window semiconductor layer between the mirror layer and the light emitting structure;
    a reflective layer under the mirror layer;
    a conductive contact layer disposed between the reflective layer and the window semiconductor layer and contacted with the second conductive semiconductor layer;
    a support substrate having a conductive property under the reflective layer; and
    a low-refractive index layer between the reflective layer and the mirror layer,
    wherein the window semiconductor layer comprises a phosphorus (P)-based semiconductor doped with carbon (C) and has a dopant concentration higher than a dopant concentration of the second conductive semiconductor layer,
    wherein the conductive contact layer includes a material different from a material of the mirror layer, and has a thickness thinner than a thickness of the window semiconductor layer,
    wherein the window semiconductor layer includes an outer portion,
    wherein the outer portion of the window semiconductor layer is disposed at a lower peripheral portion of the window semiconductor layer and is protruded outward from a sidewall of the light emitting structure,
    wherein the low-refractive index layer includes a material different from a material of the mirror layer and has a refractive index lower than a refractive index of the window semiconductor layer, and
    wherein the low-refractive index layer includes a conductive material different from conductive materials of the conductive contact layer and the mirror layer, and a plurality of contact parts contacted with the window semiconductor layer are disposed.

7. The light emitting device of claim 6, wherein the low-refractive index layer and the reflective layer have an omni-directional reflector layer structure.

8. The light emitting device of claim 1, wherein carbons (C) doped into the window semiconductor layer have a dopant concentration of 1E20 cm$^{-3}$ or more, and wherein a thickness of the outer portion of the window semiconductor layer is ½ or less of the thickness of the window semiconductor layer.

9. The light emitting device of claim 1, wherein the portion of the top surface of the second contact parts is disposed between the outer portion of the window semiconductor layer and the reflective layer, and a number of the second contact parts is in a range of 30% to 60% of a total number of the first and second contact parts, and an area of the second contact parts is in a range of 30% to 60% of a total top surface area of the first and second contact parts.

10. A light emitting device comprising:

a light emitting structure comprising a first conductive semiconductor layer, an active layer under the first conductive semiconductor layer, and a second conductive semiconductor layer under the active layer;

a first electrode on the first conductive semiconductor layer;

an electrode pad on the first electrode;

a mirror layer under the light emitting structure;

a window semiconductor layer between the mirror layer and the light emitting structure;

a reflective layer under the mirror layer;

a conductive contact layer between the reflective layer and the window semiconductor layer; and a support substrate having a conductive property under the reflective layer, wherein the window semiconductor layer comprises a phosphorus (P)-based semiconductor doped with carbon (C), wherein the window semiconductor layer has a dopant concentration higher than a dopant concentration of the second conductive semiconductor layer, wherein the conductive contact layer includes a material different from a material of the mirror layer;

wherein the conductive contact layer comprises a plurality of contact parts contacted with the window semiconductor layer, wherein the light emitting structure includes at least two elements selected from the group consisting of aluminum (Al), gallium (Ga), indium (In) and phosphorus (P), wherein the window semiconductor layer includes a GaP-based semiconductor, wherein the window semiconductor layer includes an outer portion, wherein the outer portion of the window semiconductor layer is disposed at a lower peripheral portion of the window semiconductor layer and is protruded outward from a sidewall of the light emitting structure, wherein a thickness of the outer portion of the window semiconductor layer is ½ or less of a thickness of the window semiconductor layer, and wherein a contact area of the conductive contact layer is increased proportionally to a distance between the electrode pad and the conductive contact layer.

11. The light emitting device of claim 10, wherein an interval between adjacent contact parts of the conductive contact layer is gradually narrowed, or a distribution density of the contact parts is gradually increased, proportionally to a distance between the electrode pad the conductive contact layer.

12. The light emitting device of claim 10, wherein the contact area of the conductive contact layer is decreased as the conductive contact layer is gradually closer to a region perpendicular to the electrode pad, and the contact area of the conductive contact layer is increased as the conductive contact layer is gradually away from the region perpendicular to the electrode pad.

13. The light emitting device of claim 10, wherein the plurality of contact parts of the conductive contact layer are disposed in a form of plural dots spaced apart from each other, and wherein the first electrode and the contact parts of the conductive contact layer are disposed without overlap from each other in a vertical direction.

14. The light emitting device of claim 10, further comprising a bonding layer disposed under the reflective layer and a support substrate under the bonding layer, wherein the bonding layer has a width wider than a width of the light emitting structure, wherein the active layer emits light having a wavelength in a range of 600 nm to 630 nm, and wherein carbons (C) doped into the window semiconductor layer have a dopant concentration of 1E20 cm$^{-3}$ or more.

15. The light emitting device of claim 10, wherein the thickness of the window semiconductor layer is thicker than a thickness of the second conductive semiconductor layer, and the mirror layer and the conductive contact layer have refractive indexes lower than a refractive index of the window semiconductor layer.

16. The light emitting device of claim 12, further comprising a bonding layer disposed under the reflective layer and a support substrate under the bonding layer, wherein the bonding layer has a width wider than a width of the light emitting structure, and wherein the active layer emits light having a wavelength in a range of 600 nm to 630 nm.

17. The light emitting device of claim 6, wherein the light emitting structure includes at least two elements selected from the group consisting of aluminum (Al), gallium (Ga), indium (In), and a phosphorus (P), and the window semiconductor layer includes a GaP semiconductor, and wherein the active layer emits light having a wavelength in a range of 600 nm to 630 nm.

18. The light emitting device of claim 6, wherein the conductive contact layer comprises a plurality of contact parts formed through the mirror layer and spaced apart from each other, and the reflective layer connects the connect parts of the conductive contact layer with each other, and wherein the contact parts of the conductive contact layer comprise
a plurality of first contact parts having an entire portion of a top surface overlapped with the light emitting structure in a vertical direction, respectively; and
a plurality of second contact parts having a portion of a top surface disposed outward from the sidewall of the light emitting structure.

* * * * *